US008455371B2

United States Patent
Yano et al.

(10) Patent No.: US 8,455,371 B2
(45) Date of Patent: Jun. 4, 2013

(54) SPUTTERING TARGET, METHOD FOR FORMING AMORPHOUS OXIDE THIN FILM USING THE SAME, AND METHOD FOR MANUFACTURING THIN FILM TRANSISTOR

(75) Inventors: Koki Yano, Sodegaura (JP); Hirokazu Kawashima, Sodegaura (JP); Kazuyoshi Inoue, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 12/993,946

(22) PCT Filed: May 22, 2009

(86) PCT No.: PCT/JP2009/059413
§ 371 (c)(1),
(2), (4) Date: Mar. 14, 2011

(87) PCT Pub. No.: WO2009/142289
PCT Pub. Date: Nov. 26, 2009

(65) Prior Publication Data
US 2011/0177696 A1   Jul. 21, 2011

(30) Foreign Application Priority Data

May 22, 2008   (JP) .................. 2008-134731

(51) Int. Cl.
*H01L 21/31*   (2006.01)
*C23C 14/34*   (2006.01)
*C04B 35/64*   (2006.01)
(52) U.S. Cl.
USPC .................... 438/779; 257/E21.24

(58) Field of Classification Search
USPC ............... 257/E21.24; 438/779; 204/298.13, 204/192.61; 264/681
See application file for complete search history.

(56) References Cited

U.S. PATENT DOCUMENTS

| | | | |
|---|---|---|---|
| 5,622,653 A | 4/1997 | Orita et al. | |
| 5,681,671 A | 10/1997 | Orita et al. | |
| 5,843,341 A | 12/1998 | Orita et al. | |
| 5,955,178 A * | 9/1999 | Orita et al. ................. | 428/210 |
| 7,611,646 B2 | 11/2009 | Nakayama et al. | |
| 2004/0180217 A1 | 9/2004 | Inoue et al. | |
| 2010/0009157 A1 | 1/2010 | Nakayama et al. | |

FOREIGN PATENT DOCUMENTS

| | | |
|---|---|---|
| JP | 63 210022 | 8/1988 |
| JP | 08 245220 | 9/1996 |
| JP | 2007 073312 | 3/2007 |
| JP | 2007 210823 | 8/2007 |
| WO | WO-03 014409 | 2/2003 |

OTHER PUBLICATIONS

Canon, Inc., "Sputtering target, and method of forming thin film using the target," Patent Abstracts of Japan, Publication Date: Mar. 22, 2007; English Abstract of JP-2007 073312.

(Continued)

*Primary Examiner* — Calvin Lee
*Assistant Examiner* — Monica D Harrison
(74) *Attorney, Agent, or Firm* — Oblon, Spivak, McClelland, Maier & Neustadt, L.L.P.

(57) ABSTRACT

Disclosed is a sputtering target having a good appearance, which is free from white spots on the surface. The sputtering target is characterized by being composed of an oxide sintered body containing two or more kinds of homologous crystal structures.

18 Claims, 7 Drawing Sheets

OTHER PUBLICATIONS

Hoya Corp., "Electrically conductive oxide and electrode using same," Patents Abstracts of Japan, Publication Date: Sep. 24, 1996; English Abstract of JP-08 245220.

Jeong, J. K. et al., "High performance thin film transistors with cosputtered amorphous indium gallium zinc oxide channel," Applied Physics Letters, 2007, vol. 91.

Kimizuka, N. et al., "Syntheses and single-crystal data of homologous compounds, $In_2O_3(ZnO)m$ (m=3,4, and 5), $InGaO_3(ZnO)_3$, and $Ga_2O_3(ZnO)_m$ (m=7,8,9, and 16) in the $In_2O_3$—$ZnGa_2O_4$—$ZnO$ System," Journal of Solid State Chemistry, 1995, vol. 116, pp. 170-178.

Nakamura, M. et al., "The phase relations in the $In^2O^3$-$Ga^2ZnO^4$-ZnO System at 1350° C," Journal of Solid State, 1991, vol. 93, pp. 298-315.

Natl Inst for Res in Inorg Mater, "Compound having laminar structure of hexagonal crystal system expressed by ingazn306 and it's production," Patent Abstracts of Japan, Publication Date: Aug. 31, 1988; English Abstract of JP-63 210022.

Sumitomo Metal Mining Co Ltd., "Oxide sintered compact, oxide film obtained using the same and transparent substrate containing the same," Patent Abstracts of Japan, Publication Date: Aug. 23, 2007; English Abstract of JP-2007 210823.

K. Kato, et al., "Die Kristallstruktur von $Yb_2Fe_3O_7$", Zeitschrift für Kristallographie, National Institute for Research in Inorganic Materials, Bd. 143, 1976, pp. 278-284 (With English Abstract).

Noboru Kimizuka, et al., "Homologous Compounds, $InFeO_3(ZnO)_m$ (*m*=1-9)", Journal of Solid State Chemistry, National Institute for Research in Inorganic Materials, vol. 74, 1988, pp. 98-109.

\* cited by examiner

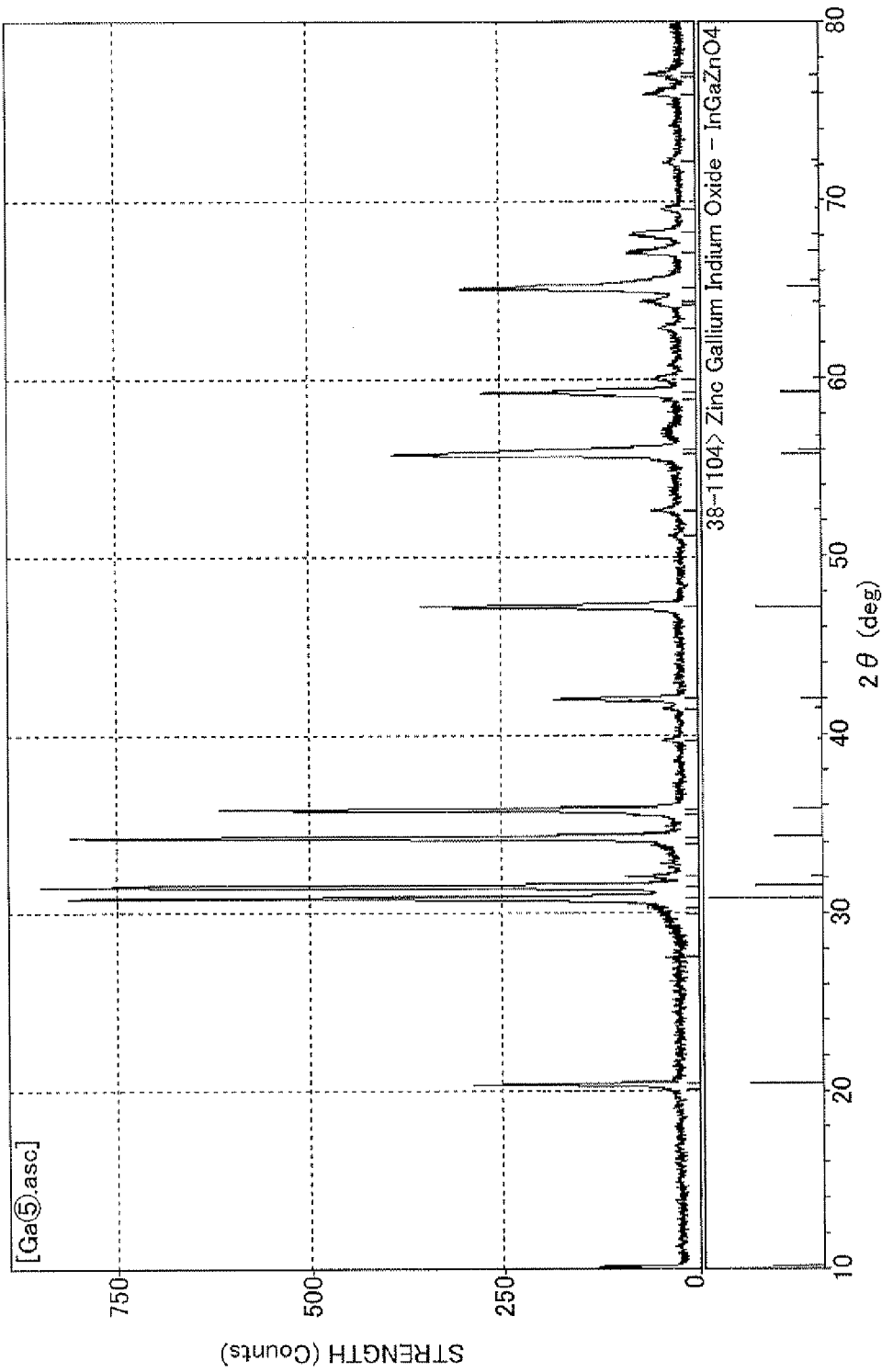

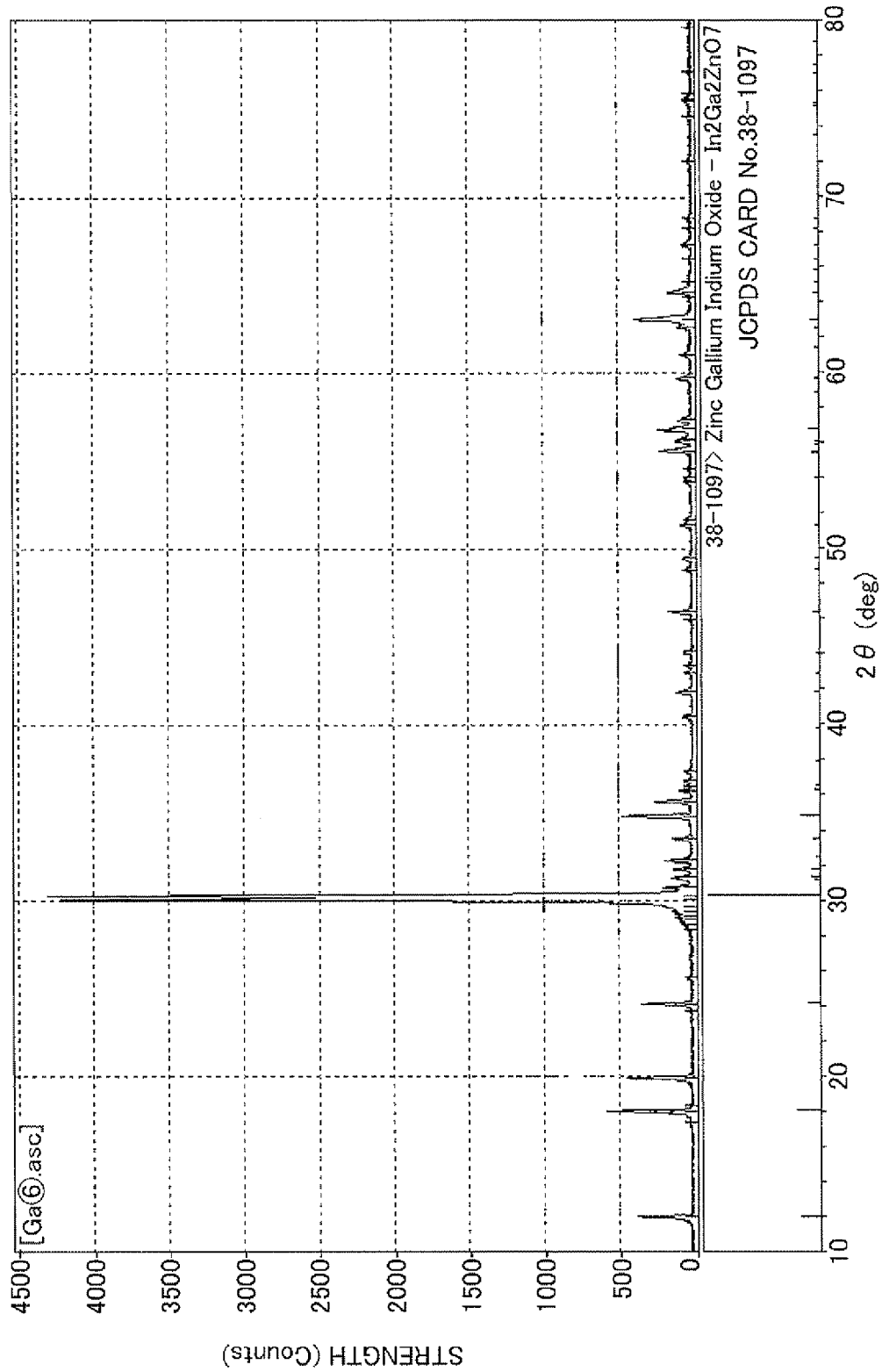

FIG.4(a)
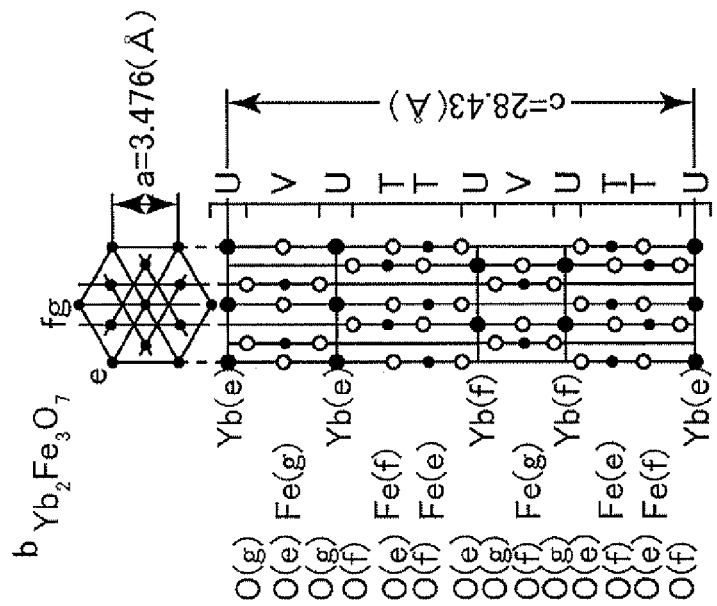
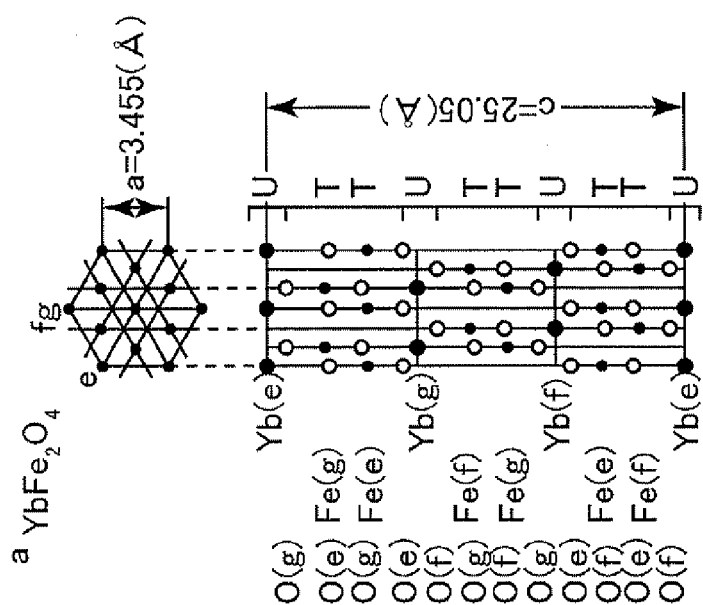
FIG.1. e, f, and g indicate three sets of triangular lattices as shown in the upper parts of the figures.
(a)

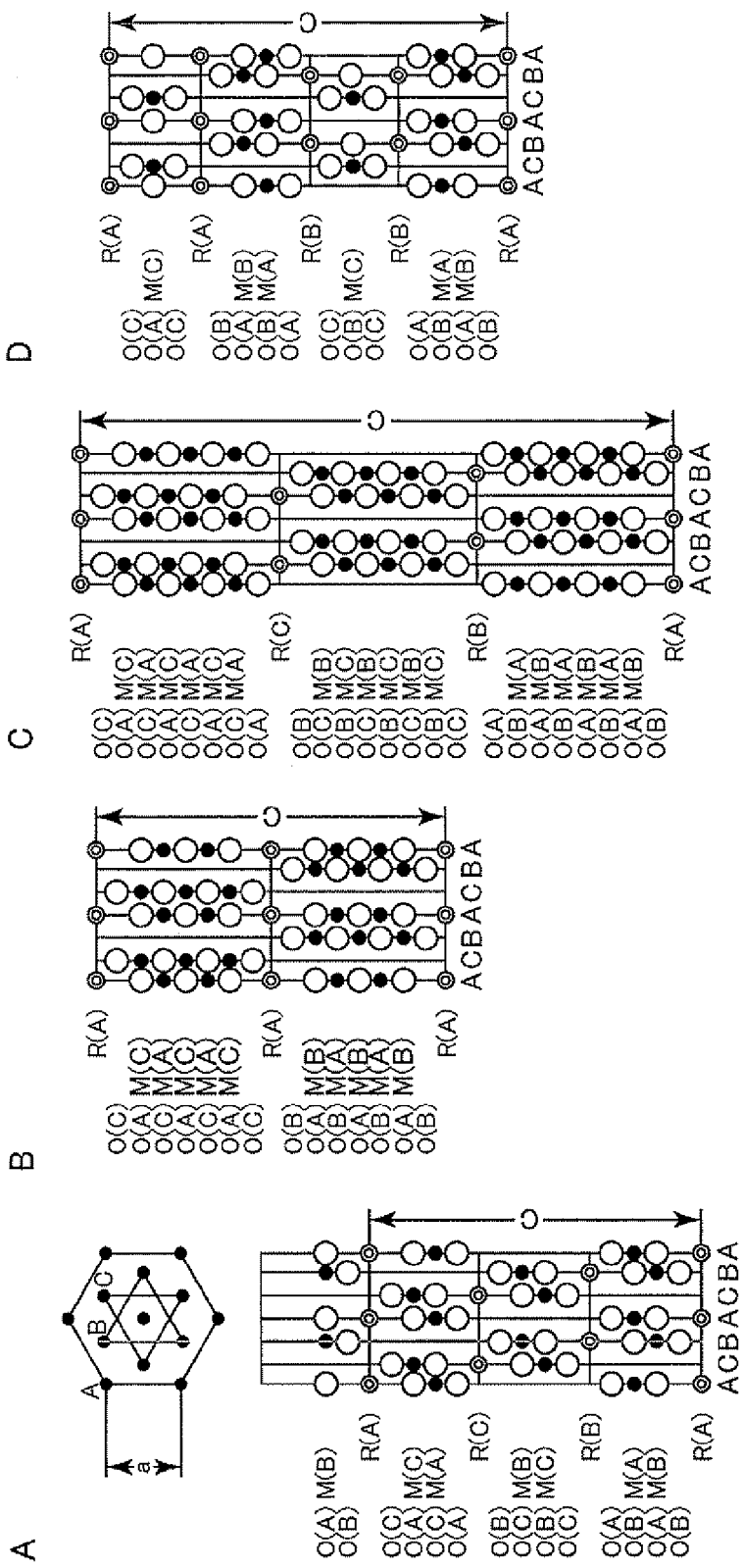
FIG.1.The crystal structural models of LuFeO$_3$(ZnO) in A, LuFeO$_3$(ZnO)$_4$ in B, LuFeO$_3$(ZnO)$_5$ in C, and Yb$_2$Fe$_3$O$_7$ in D: A, B, and C represent three kinds of triangular lattices. M sites are occupied by Fe and/or Zn ions for LuFeO$_3$(ZnO)$_m$, and Fe for Yb$_2$Fe$_3$O$_7$. ◎, Lu or Yb ion; ●, M ion; ○, O ion.
(b)

SPUTTERING TARGET, METHOD FOR FORMING AMORPHOUS OXIDE THIN FILM USING THE SAME, AND METHOD FOR MANUFACTURING THIN FILM TRANSISTOR

TECHNICAL FIELD

The present invention relates to a sputtering target characterized by an oxide sintered body which comprises two or more homologous crystal structures, a method for forming an amorphous oxide thin film using the target, and a method for manufacturing a thin film transistor.

BACKGROUND OF THE ART

Oxide semiconductor films comprised of some metallic composite oxides have high mobility property and good optical transparency for visible light. Therefore, the films are used for variety of applications such as switching elements or drive circuit elements for a liquid crystal display device, a thin film electroluminescence display device, an electrophoresis method display device, and a powder transfer method display device. Especially, oxide semiconductor films comprising indium oxide/zinc oxide are brought to attention in light of their ease of manufacture, price, or outstanding properties. Specifically, oxides comprising indium oxide/gallium oxide/zinc oxide, or oxide semiconductor films comprising those oxides as a major component have a benefit concerning mobility property which is higher than that of amorphous silicon films. Such oxide semiconductors are usually produced by a sputtering method using a sputtering target composed of each oxide such as indium oxide/gallium oxide/zinc oxide (Patent Documents 1 and 2).

Patent Document 4 discloses a compound of $InGaO_3(ZnO)_m$ and a method for producing the compound, and the presence of the compound is confirmed. However, there is no disclosure about bulk resistance value, and there is a problem to use the compound for a sputtering target (Patent Document 4). In addition, as for a target comprising one homologous structure, a target comprising $InGaO_3(ZnO)$ (see Patent Document 2 and [0091] of Patent Document 1) and a target comprising $In_2Ga_2O_6(ZnO)$ (see [0087] of Patent Document 1) are known, but there is no discussion about a target comprising two or more homologous structures or an effect thereof.

Furthermore, for example, a sputtering target comprised of indium oxide/gallium oxide/zinc oxide using the compound of $InGaO_3(ZnO)_m$ (an oxide sintered body showing a crystalline structure of homologous phase) causes an abnormal electrical discharge by anomalous growth of the compound shown by $InGaO_3(ZnO)_m$ during sputtering, and thus there was a problem about defects on the obtained film (see Patent Document 2). In addition, as for a sputtering target composed of indium oxide/gallium oxide/zinc oxide, a target comprising a compound containing an zinc oxide of $A_XB_YO_{(KaX+KbY)/2}(ZnO)_m$ ($1<m$, $X \leq m$, $0<Y \leq 0.9$, $X+Y=2$) as a major component is known (see Patent Document 3). However, this sputtering target has problems, for example, the target tends to cause defective appearance such as concavity and convexity found on a surface of the target so-called White-spot; sputtering rate becomes slow; dusts (or particles) of a sputtering material are generated at the sputtering; arc discharge is emitted (arcing), many nodules (agglomerates found on a surface of the sputtering target) are created; there are many differences in quality such as relative density or bulk resistance; and it is difficult to form a large-area film uniformly.

Additionally, a sputtering target composed of an oxide sintered body comprising two or more homologous crystal structures was not known.

Patent Document 1: JP Patent Application Publication No. H08-245220
Patent Document 2: JP Patent Application Publication No. 2007-73312
Patent Document 3: JP Patent Application Publication No. 2007-210823
Patent Document 4: JP Patent Application Publication No. S63-210022
Non-patent Document 1: K. Kato, I. Kawada, N. Kimizuka and T. Katsura, Z. Kristallogr, vol. 143, p. 278, (1976)
Non-patent Document 2: N. Kimizuka, T. Mohri. Y. Matsui and K. Shiratori, J. Solid State Chem., vol. 74, p. 98, (1988)

DISCLOSURE OF THE INVENTION

Problems to be Solved by the Present Invention

The first object of the present invention is to provide a sputtering target having good appearance without White-spot on the surface of the target.

The second object of the present invention is to provide a sputtering target having fast sputtering rate.

The third object of the present invention is to provide a sputtering target capable of direct current (DC) sputtering during the formation of a film by sputtering, as well as not causing arcing (abnormal discharge); less creating particles (dusts) or nodules; and providing high density, less scattering in its quality and advanced mass productivity.

The fourth object of the present invention is to provide a thin film, preferably a protective film, obtained by using the sputtering target; and a method for manufacturing a thin film transistor comprising the film.

Means for Solving the Problems

The present inventors intently made their studies, and then found that if an oxide sintered body where two or more homologous crystals co-exist is used as an oxide sintered body for a sputtering target, in comparison with the use of only one homologous structure, less White-spot is occurred, the obtained target has good appearance, sputtering becomes stable, particles (or dusts) of a sputtering material during sputtering can be reduced, and sputtering rate becomes higher, and thus the inventors conceived the present invention.

The present invention may relate to the followings.

1. A sputtering target composed of an oxide sintered body containing two or more homologous crystal structures.
2. The sputtering target of Item 1, wherein the homologous crystal structures comprise two kinds of structures which are an $InMO_3(ZnO)_m$ type crystal structure and a $(YbFeO_3)_2FeO$ type crystal structure.
3. The sputtering target of Item 1 or 2, wherein the oxide sintered body includes Indium element (In), Gallium element (Ga), and Zinc element (Zn), and wherein the homologous crystal structures comprise two kinds of structure which are an $InGaO_3(ZnO)_{m1}$ type crystal structure and an $InGaO_3(ZnO)_{m2}$ type crystal structure such that m1 is different from m2.
4. The sputtering target of Item 1 or 2, wherein the oxide sintered body includes Indium element (In), Gallium element (Ga), and Zinc element (Zn), and wherein the oxide sintered body contains an $InGaZn_mO_{3+m}$ crystal phase indicating an $InMO_3(ZnO)_m$ type crystal structure, and an $In_2Ga_2ZnO_7$ crystal phase indicating a $(YbFeO_3)_2FeO$ type crystal structure.

5. The sputtering target of Item 4, wherein a maximum peak strength of X-ray diffraction for the $InGaZnO_4$ crystal phase P(1) and a maximum peak strength of X-ray diffraction for the $In_2Ga_2ZnO_7$ crystal phase P(2) meet a peak strength ratio of P(1)/P(2)=0.05~20.

6. The sputtering target of Item 1 or 2, wherein the oxide sintered body includes Indium element (In), Gallium element (Ga), and Zinc element (Zn), and wherein the oxide sintered body contains an $InGaZnO_4$ crystal phase indicating $InMO_3(ZnO)_m$ type crystal structure, and an $In_2Ga_2Zn_2O_5$ crystal phase indicating a $InMO_3(ZnO)_m$ type crystal structure.

7. The sputtering target of any one of Items 1 to 6, wherein the oxide sintered body contains a metal element (X) having positive four or more valences.

8. The sputtering target of Item 7, wherein the metal element (X) having positive four or more valences is one or more elements selected from the group consisting of tin, zirconium, germanium, cerium, niobium, tantalum, molybdenum, tungsten, and titanium.

9. The sputtering target of Item 7 or 8, wherein the oxide sintered body comprises an $InGaZn_mO_{3+m}$ crystal phase indicating $InMO_3(ZnO)_m$ type crystal structure in which a part of In or Ga is substituted by the metal element having positive four or more valences, or an $In_2Ga_2ZnO_7$ crystal phase indicating a $(YbFeO_3)_2FeO$ type crystal structure in which a part of In or Ga is substituted by the metal element having positive four or more valences.

10. A method for preparing a sputtering target of any one of Items 1 to 9 comprising the following steps;
(a) mixing a crude oxide powder;
(b) forming the obtained mixture; and
(c) sintering the obtained formed body.

11. A method for forming an amorphous oxide thin film having less than $10^{18}/cm^3$ of electric carrier concentration, comprising a step of;
(i) conducting sputtering using the sputtering target of any one of Items 1 to 9 at 25 to 450° C. of film forming temperature.

12. The method of Item 11 wherein the amorphous oxide thin film is used for a channel layer of a thin film transistor.

13. A method for manufacturing a thin film transistor containing an amorphous oxide thin film and an oxide insulation layer, comprising steps of
(ii) heat-treating the amorphous oxide thin film formed by Item 11 within oxidation atmosphere; and
(iii) forming the oxide insulation layer on the heat treated amorphous oxide thin film.

14. The sputtering target of any one of Items 1 to 9, wherein In, Ga, and Zn are present in the following atom ratio;

$0.1 \leq In/(In+Ga+Zn) \leq 0.9$ $0.05 \leq Ga/(In+Ga+Zn) \leq 0.6$ $0.05 \leq Zn/(In+Ga+Zn) \leq 0.9.$ 15. The method for preparing a sputtering target of Item 10, wherein In, Ga, and Zn are mixed in the following atom ratio;

$0.1 \leq In/(In+Ga+Zn) \leq 0.9$ $0.05 \leq Ga/(In+Ga+Zn) \leq 0.6$ $0.05 \leq Zn/(In+Ga+Zn) \leq 0.9.$ 16. The method for preparing a sputtering target of Item 10 or 15, wherein sintering is conducted at 1440 to 1600° C. for 0.5 to 15 hours.

17. The method for preparing a sputtering target of Item 10, 15 or 16, wherein the sintering is conducted within oxygen gas atmosphere.

Effect of the Present Invention

The present invention provides a sputtering target having properties such as good appearance with less possibility of forming White-spot, good stability in sputtering, reduced formation of particles (or dusts) of sputtering material during sputtering, and accelerated sputtering rate.

The present invention allows to form two kinds of homologous crystals simultaneously by the specific production method or the specific production conditions (such as sintering temperature or sintering time).

The present invention also provide a sputtering target comprising both an oxide crystal represented by $InGaZnO_4$ and an oxide crystal represented by $In_2Ga_2ZnO_7$, and then the present invention can solve the above-mentioned problems suitably.

The sputtering target of the present invention is used for producing semi-conductors to make an excellent oxide semi-conductors or TFTs.

PREFERRED EMBODIMENTS OF THE INVENTION (1) Sputtering Target
A sputtering target of the present invention comprises an oxide sintered body containing two or more homologous crystal structures.
(1-1) Homologous Crystal Structure
The term "homologous crystal structure" means a crystal structure composed of a "natural superlattice" structure having long period lapping several crystal layers of different material. If crystal period or thickness of each layer is around nanometer order, particular properties can be obtained by the combination of chemical composition or thickness of each layer, which properties are different from those obtained from a crystal of a single material or of a unified mixture of each layer. A crystal structure of a homologous phase can be confirmed, for example, from the fact whether or not X-ray diffraction pattern of a target ground powder corresponds to X-ray diffraction pattern of a crystal structure of homologous phase which pattern is expected from its composition ratio. Specifically, it is confirmed from the correspondence between the pattern and X-ray diffraction pattern of a crystal structure of a homologous phase obtained from JCPDS (Joint Committee of Powder Diffraction Standards) cards.

In this connection, an oxide sintered body containing only one homologous crystal structure has disadvantages such as reduction on bending strength (JIS R1601), reduction on relative density, taking a long time for sintering, and increase of White-spots (pinholes), compared with those of the oxide sintered body containing two or more homologous crystal structures.

Meanwhile, as is the case with the present invention, by co-presence of two or more homologous crystals in an oxide sintered body, it becomes difficult to form White-spots, good appearance is obtained, sputtering becomes stable, forming of particles is reduced, and sputtering rate becomes higher. Although it is not so clear the reason why the sputtering rate becomes higher, the reason would be based on that charge-up during sputtering is reduced by uniformly dispersing crystal particles having slightly different resistances.

The oxide crystal having the homologous crystal structure includes an oxide crystal shown by $RAO_3(MO)_m$. R is a positive tervalent metal element such as In, Ga, Al, Fe, or B. A is a positive tervalent metal element other than R such as Ga, Al, or Fe. M is a positive bivalent metal element such as Zn or Mg. Each of R, A and M may independently be the same metal element as one another, or a different metal element from one another. m is, for example, integer, preferably 0.1 to 10, further preferably 0.5 to 7, and more preferably 1 to 3.

The homologous crystal structure of the oxide sintered body of the present invention may preferably be an $InMO_3(ZnO)_m$ type crystal structure or a $(YbFeO_3)_2FeO$ type crystal structure. M is a positive tervalent metal element, for example, metal elements in Group IIIB such as Ga, Al, or B. More preferably, M is Al or Ga, further preferably, M is Ga. In addition, M may be partially substituted by a metal element other than Al, Ga, or Fe. If M is tervalent, the homologous crystal structure shows an $InMO_3(ZnO)_m$ type crystal structure. m is, for example, integer, preferably 0.5 to 10, further preferably 1 to 8, more preferably 1 to 3, and especially 1. If m is 8 or under, the atom ratio of Zn in ZnO is 80% or less, bending strength is not reduced, bulk resistance is not going up, relative density is not reduced.

Among Zn, M and In which constitute the homologous crystal structure, at least a part of the one of elements may be substituted by another element. For example, valence of an element to be substituted by Zn is preferably two or more. Valence of an element to be substituted by M or In is preferably three or more. By substituting at least a part of the one of elements selected from Zn, M and In to another element, an electron is injected into an oxide. The substitution of at least a part of the one of elements selected from Zn, M and In to another element can be confirmed by a shift of lattice constant (interstitial distance) calculated from X-ray diffraction, or structural analysis using high brightness emitted light. Specifically, the lattice constant is decided by Rietveld analysis.

A part of In which constitutes the homologous crystal structure is preferably partially substituted by a metal element (X) having positive four or more valences. The metal element (X) having positive four or more valences may comprises, for example, one or more elements selected from tin, zirconium, germanium, cerium, niobium, tantalum, molybdenum, tungsten, and titanium. The substitution of at least a part of the one of elements selected from In to the metal element (X) having positive four or more valences can be confirmed by shift of interstitial distance calculated from X-ray diffraction, or structural analysis using high brightness emitted light. Specifically, lattice constant is decided by Rietveld analysis.

The homologous crystal structure of the oxide sintered body of the present invention is preferably an $InGaO_3(ZnO)_{m1}$ type crystal structure and an $InGaO_3(ZnO)_{m2}$ type crystal structure. These m1 and m2 are different from each other, either or both of m1 and m2 are, for example, integer, preferably 0.5 to 10, further preferably 1 to 8, more preferably 1 to 3, in particular, preferably 1.

Specifically, the oxide sintered body of the present invention is preferably an $InGaZn_mO_{3+m}$ crystal phase indicating $InMO_3(ZnO)_m$ type crystal structure, and an $In_2Ga_2ZnO_7$ (or $(InGaO_3)_2ZnO$) crystal phase indicating a $(YbFeO_3)_2FeO$ type crystal structure, where m has the same definition as that of the above-mentioned m. The $InMO_3(ZnO)_m$ type crystal structure and a $(YbFeO_3)_2FeO$ type crystal structure are basically an octahedral structure of $InO_6$. Since these crystal structures have such an octahedral structure of $InO_6$, it can be expected that an oxide semi-conductor obtained by sputtering a sputtering target composed of the oxide sintered body of the present invention which comprises these crystal structures forms an electrically-conducting path within the semi-conductor itself to have high carrier mobility.

In addition, crystal phases indicating the homologous crystal structure of the present invention may include, for example, $InGaO_3(ZnO)_m$, $InAlO_3(ZnO)_m$, $InFe(ZnO)_m$, $(InGaO_3)_2ZnO$, $In_2O_3(ZnO)_m$, wherein m has the same definition as that stated above.

At least one of the oxide crystals indicating the homologous crystal structures is preferably an oxide crystal phase shown by $InGaO_3(ZnO)_m$ (m is, for example, integer, preferably 1 to 8, more preferably 1 to 3). If the oxide sintered body of the present invention contains such an at least one or more oxide crystals, a sputtering target composed of the oxide sintered body can be used for making an excellent oxide semi-conductor and then a thin film transistor having good carrier mobility and good TFT properties such as on-off ratio.

(1-2) Relative Amount of a Homologous Crystal Structure

Relative amount of each crystal structure may be confirmed based on strength ratio at the maximum peak of X-ray diffraction. Although any X-ray diffraction may be used for the diffraction, for example, 2 θ-θ reflection method is desirable. In the strength ratio at the maximum peak, the maximum peak is strength at an angle where JCPDS pattern identified by each crystal shows maximum strength. For example, when the oxide sintered body of the present invention has two kinds of crystal structure corresponding to the maximum peak strengths (P(1)) and (P(2)), strength ratio at the maximum peak of each crystal structure (P(1)/P(2)) is generally 0.01 to 100, preferably 0.05 to 20, more preferably 0.2 to 5, further preferably 0.4 to 2.5, and especially preferably 0.5 to 2. When the oxide sintered body of the present invention includes two kinds of crystal structure of $InMO_3(ZnO)_m$ type and $(YbFeO_3)_2FeO$ type, strength ratio at the maximum peak of each crystal structure is generally 0.01 to 100, preferably 0.05 to 20, more preferably 0.2 to 5, further preferably 0.4 to 2.5, especially preferably 0.5 to 2. If the strength ratio at the maximum peak is 0.05 to 20, variation for a transistor obtained by sputtering the oxide sintered body of the present invention is not widened, bulk resistance is reduced, bending strength (JIS R1601) is increased, relative density is increased, and then a sputtering target without defective appearance such as White-spot may be provided.

Drawings of crystal structures (FIG. 4) are shown to explain the difference of crystal structures of $InMO_3(ZnO)_m$ type and $(YbFeO_3)_2FeO$ type.

(1-3) Contained Elements

The oxide of the present invention includes Indium element (In), Gallium element (Ga), and Zinc element (Zn). More preferably, the oxide includes a metal element (X) having positive four or more valences. The metal element (X) having positive four or more valences comprises one or more elements selected from the group consisting of tin, zirconium, germanium, cerium, niobium, tantalum, molybdenum, tungsten, and titanium. When these metal elements (X) are added to the oxide of the present invention, bulk resistance of the oxide itself is reduced, and abnormal electrical discharge appeared on a sputtering target during sputtering the oxide is also reduced.

An oxide thin film obtained from a sputtering target using an oxide of the present invention is an amorphous film. Added quadrivalent metals provide a film having no doping effect and sufficiently reduced electron density. Therefore, if this oxide membrane film is used as a oxide semiconductor film, higher stability is obtained, Vth shift caused by bias-stress is restrained, and operation as a semi-conductor is stabilized.

The Vth is voltage at rise of drain current when gate voltage (drain voltage) is applied. The Vth shift is movement of Vth when gate voltage (drain voltage) is applied. If the Vth shift is small, it can be said that the operation as a semi-conductor is stabilized.

Atom ratio of each element among Indium element (In), Gallium element (Ga), and Zinc element (Zn) preferably meets the following relationships (1) to (3).

$$0.1 \leq \text{In}/(\text{In}+\text{Ga}+\text{Zn}) \leq 0.9 \quad (1)$$

$$0.05 \leq \text{Ga}/(\text{In}+\text{Ga}+\text{Zn}) \leq 0.6 \quad (2)$$

$$0.05 \leq \text{Zn}/(\text{In}+\text{Ga}+\text{Zn}) \leq 0.9 \quad (3)$$

wherein, "In", "Ga" or "Xn" means number of atoms for Indium element (In), Gallium element (Ga), or Zinc element (Zn), respectively.

If In/(In+Ga+Zn) is 0.1 or higher, relative density is not reduced, and carrier mobility of a thin-film transistor (TFT) obtained from the sputtering target is increased, and thus it is preferable. 0.9 or less is also preferable so that nodules are not created, and off-current is not increased.

If Ga/(In+Ga+Zn) is 0.05 or higher, White-spot is not appeared, and off-current at the making of a thin-film transistor (TFT) obtained from the sputtering target is not increased, and thus it is preferable. 0.6 or less is also preferable so that relative density is increased with reducing bulk resistance, and carrier mobility is also increased.

If Zn/(In+Ga+Zn) is 0.05 or higher, White-spot is not appeared, and there is no adverse effect at the making of a thin-film transistor (TFT) obtained from the sputtering target or at the time of wet etching, and thus it is preferable. 0.9 or less is also preferable because there is no chemical unstability and no reduction on moisture resistance at the making of a thin-film transistor (TFT) obtained from the sputtering target.

More preferably, $$0.2 \leq \text{In}/(\text{In}+\text{Ga}+\text{Zn}) \leq 0.5 \quad (1)$$

$$0.1 \leq \text{Ga}/(\text{In}+\text{Ga}+\text{Zn}) \leq 0.5 \quad (2)$$

$$0.25 \leq \text{Zn}/(\text{In}+\text{Ga}+\text{Zn}) \leq 0.5 \quad (3)$$

are met, and particularly, $$0.3 \leq \text{In}/(\text{In}+\text{Ga}+\text{Zn}) \leq 0.5 \quad (1)$$

$$0.3 \leq \text{Ga}/(\text{In}+\text{Ga}+\text{Zn}) \leq 0.5 \quad (2)$$

$$0.3 \leq \text{Zn}/(\text{In}+\text{Ga}+\text{Zn}) \leq 0.5 \quad (3)$$

are preferable.

In addition, if Ga/(In+Ga+Zn)≦0.38 is met, bulk resistance value can be readily reduced, even if no element having positive four valences such as Sn or Ge is contained. If such an reduced effect is required, Ga/(In+Ga+Zn)≦0.32 is more preferable, and Ga/(In+Ga+Zn)≦0.23 is particularly preferable.

It is preferable that when the oxide of the present invention includes a metal element (X) having positive four or more valences, and when total of Indium element (In), Gallium element (Ga), Zinc element (Zn), and the metal element (X) having positive four or more valences (In+Ga+Zn+X) are 100%, additive amount (atom ratio) of the metal element (X) having positive four or more valences is 100 to 10000 ppm, preferably 200 ppm to 5000 ppm, further preferably 500 ppm to 3000 ppm. If the amount is 100 ppm or higher, an effect for the addition is sufficiently obtained. If the amount is 10000 ppm or less, an oxide thin film having sufficient stability is obtained, then carrier mobility is increased, and thus it is preferable.

Among Indium element (In), Gallium element (Ga), and Zinc element (Zn) each of which is contained in the oxide sintered body of the present invention, a part of In or Ga is preferably replaced with the metal element (X) having positive four or more valences. Specifically, an oxide sintered body comprising an $\text{InGaZn}_m\text{O}_{3+m}$ crystal phase indicating $\text{InMO}_3(\text{ZnO})_m$ type crystal structure in which a part of In or Ga is replaced with the above-mentioned metal element having positive four or more valences, or an $\text{In}_2\text{Ga}_2\text{ZnO}_7$ crystal phase indicating a $(\text{YbFeO}_3)_2\text{FeO}$ type crystal structure in which a part of In or Ga is replaced with the above-mentioned metal element having positive four or more valences is adequate. When the element having positive four or more valences replaces a part of In, the element can reduce bulk resistance of a target by producing a carrier.

The fact of the replacement by the aforesaid metal element having positive four or more valences can be confirmed by a shift of interstitial distance calculated from X-ray diffraction, or by structural analysis using high brightness emitted light.

(1-4) Structure of Crystal Phase

The oxide sintered body of the present invention preferably has an $\text{InGaZn}_m\text{O}_{3+m}$ crystal phase indicating $\text{InMO}_3(\text{ZnO})_m$ type crystal structure, or an $\text{In}_2\text{Ga}_2\text{ZnO}_7$ crystal phase indicating a $(\text{YbFeO}_3)_2\text{FeO}$ type crystal structure. The inclusion of these crystal phases in the oxide sintered body of the present invention can be confirmed by checking if X-ray diffraction pattern of the oxide of the present invention such as the pattern of a target ground powder corresponds to X-ray diffraction pattern of a crystal structure of homologous phase which pattern is expected from its composition ratio. Specifically, it is confirmed when the pattern corresponds to X-ray diffraction pattern of a crystal structure of homologous phase obtained from JCPDS (Joint Committee of Powder Diffraction Standards) cards. For instance, whether or not an oxide sintered body includes an $\text{InGaZnO}_4$ crystal phase and an $\text{In}_2\text{Ga}_2\text{ZnO}_7$ crystal phase each of which is one of the preferred embodiments of the present invention can be decided by the correspondence of X-ray diffraction pattern of a crystal structure with JCPDS card No. 38-1104 and No. 38-1097.

(1-5) Relative Ratio of Each Crystal Phase

The amount of each crystal phase of a crystal structure of homologous phase of the oxide sintered body of the present invention may be confirmed by strength ratio at the maximum peak of X-ray diffraction. Specifically, a peak strength of each crystal phase is determined by X-ray diffraction, and then the amount ratio of the crystal phase of the present invention is obtained from the ratio of the peak area. For example, by using an X-ray analyzation equipment Ultima-III provided by RIGAKU Co., an oxide sintered body is subjected by the X-ray analyzation equipment. Assuming that a maximum peak strength for a certain crystal phase is P(1), and that a maximum peak strength for another crystal phase is P(2), a peak strength ratio of P(1)/P(2) is preferably 0.05 to 20, more preferably 0.2 to 5, further preferably 0.4 to 2.5, and especially preferably 0.5 to 2. The peak strength ratio calculated above is equal to the content ratio (mass ratio) of the crystal phases.

If the peak strength ratio (content ratio) is in 0.05 to 20, bulk resistance is kept in lower level, relative density is increased, and the appearance of White-spot is prevented, and thus it is preferable.

More specifically, when the maximum peak strength for the oxide crystal represented by $\text{InGaZnO}_4$ is P(1), and when the maximum peak strength for the oxide crystal represented by $In_2Ga_2ZnO_7$ (or $InGaZn_2O_5$) is P(2), the peak strength ratio P(1)/P(2) is preferably 0.05 to 20, more preferably 0.2 to 5, further preferably 0.4 to 2.5, and especially preferably 0.5 to 2.

(1-6) Physical Properties of an Oxide Sintered Body (a) Average Particle Diameter of Crystals The average particle diameter for each oxide crystal is preferably 20 µm or less, more specifically 0.1 to 10 µm, and especially preferably 0.2 to 5 µm. If the average particle diameter for an oxide crystal is 20 µm or less, no pores (or no hollow foams) are produced in a sintered body, and no abnormal discharge between a sputtering target and an electrode is occurred during sputtering, and thus it is preferable. The average particle diameter means an average particle diameter for the maximum particle diameter, and the maximum particle diameters is determined by, for example, embedding an obtained sintered body in a resin, polishing the surface of the body by aluminum particles having particle size of 0.05 µm, and then, measuring a maximum particle diameter of $(Ga, In)_2O_3$ crystal particles at five locations observed within 50 µm×50 µm square frame of the sintered body surface which is magnified 5000 times by X-ray microanalyzer (EPMA) named JXA-8621MX (JOEL Ltd.). Average of the maximum values of the maximum particle diameters in each location (the maximum particle diameter for the biggest particle within each location) is the average particle diameter for the maximum particle diameters. In this connection, a circumscribed diameter (the longest diameter for the specific particle) is the maximum particle diameter.

A particle diameter ratio between two or more crystals is preferably 0.25 to 4, and more preferably 0.5 to 2. If the particle diameter ratio is 0.25 to 4, no pores (or no hollow foams) are produced in a sintered body, and no abnormal discharge between a sputtering target and an electrode is occurred during sputtering, and thus it is preferable.

Each crystal phase for $InMO_3(ZnO)_m$ type and $(YbFeO_3)_2$ FeO type may have an excessive oxygen or an insufficient oxygen (oxygen defect) as long as its structure is decided by X-ray diffraction pattern (may meet or not meet stoichiometric ratio), but each crystal phase preferably has an oxygen defect. A crystal phase having an oxygen defect is preferable since it can excellently keep bulk resistance when the crystal phase is used for a sputtering target.

(b) Size of Pinhole

The surface of the oxide sintered body of the present invention preferably has no pinhole. The pinhole is a void created between oxide particles during the preparation of the oxide of the present invention by sintering the oxide particles. Presence or absence of the pinhole can be evaluated by horizontal Feret diameter. When the pinhole is deemed as a particle, the horizontal Feret diameter is a distance between two parallel lines toward a certain direction in which the lines are clipping the particle. The horizontal Feret diameter can be determined by observing a SEM image. The horizontal Feret diameter of the surface of the oxide of the present invention is preferably 50 pinholes/mm$^2$ or less where the pinholes have 2 µm or greater Feret diameter present in an oxide per unit area (1 mm×1 mm). 20 pinholes/mm$^2$ or less is more preferable, and 5 pinholes/mm$^2$ or less is further preferable. If the number of pinholes having 2 µm or greater Feret diameter is 50 pinholes/mm$^2$ or less, and if the oxide of the present invention is used as a sputtering target, no abnormal electrical discharge is appeared during sputtering, and smoothness of the obtained sputtering film is increased.

(c) Relative Density

Relative density of the oxide sintered body of the present invention is, for example, 75% or more, usually 80% or more, preferably 90% or more, more preferably 95% or more, and especially preferably 99% or more. If relative density is 75% or more, when the oxide sintered body of the present invention is used as a sputtering target, the target is less breakable, and no abnormal electric discharge is occurred, and thus it is preferable. The relative density is density relatively calculated from theoretical density obtained by weighted average. A density calculated by weighted average of the density of each crude powder is the theoretical density, which density is set as 100%.

It is desirable that the range of variation of the relative density of the oxide sintered body is in 3%, and preferably in 1%. The variation is a value indicated by standard deviation against an average value. For example, the average and standard deviation are obtained by cutting 20 or more of small pieces out of an oxide and then determining density of each piece.

(d) Bulk Resistance

Bulk resistance of the oxide sintered body of the present invention is, for example, 0.1 to 17 mΩcm, preferably 0.2 to 10 mΩcm, and more preferably 0.3 to 5 mΩcm. If the bulk resistance is 0.1 mΩcm or more, no abnormal discharge between particles of a sputtering material during sputtering is caused, and thus it is preferable. If the bulk resistance is 17 mΩcm or less, it is preferable since the target is less breakable, discharge is not unstable, and particles are not increase even when the oxide of the present invention is used as a sputtering target.

In addition, it is desirable that the range of variation (uniformity) of the bulk resistance of the oxide is in 3%, and preferably in 1%. The variation is a value indicated by standard deviation against an average value of the bulk resistance. The bulk resistance is determined by, for example, measuring an oxide surface at 50 or more of equally spaced points, by four-point probe method using LORESTA (Mitsubishi chemical Co.).

(e) Variation of the Number of Positive Elements

It is desirable that the range of variation of the number of positive metal elements other than zinc contained in the oxide sintered body is in 0.5%, and preferably in 0.1%. The variation means a value indicated by standard deviation against an average value. For example, the average and standard deviation are obtained by cutting 20 or more of small pieces out of an oxide and then determining a content of each positive metal element other than zinc by a plasma emission spectrometer (ICP), and thus the variation is determined.

(f) Surface Roughness

Surface roughness (Ra) of the sputtering target of the present invention is desirably Ra≦0.5 µm, preferably Ra≦0.3 µm, and more preferably Ra≦100 nm. No directional character on a polished surface is preferable so that no abnormal discharge is caused and the presence of particles can be reduced. If the surface roughness (Ra) is 0.5 µm or less, abnormal discharge during sputtering is inhibited, creation of dusts (particles) of a sputtering material is reduced, and thus it is preferable. The surface roughness means center line average roughness.

(g) Bending Strength

Bending strength of the spattering target of the present invention is, for example, preferably 4 kg/mm$^2$ or more, more preferably 6 kg/mm$^2$ or more, and especially preferably 8 kg/mm$^2$ or more. The bending strength is also known as crossbreaking strength. The bending strength is estimated based on JIS R1601 by using a bending strength tester. If the bending strength is 4 kg/mm$^2$ or more, the sputtering target is less breakable during sputtering, and the sputtering target is less damaged even when a backing plate as a support of the sputtering target is adhered to the sputtering target, or when the sputtering target is transferred.

(2) Method for Preparing a Sputtering Target

The sputtering target of the present invention is desirably prepared by the following method.
(a) mixing a crude oxide powder (mixing step);
(b) forming the obtained mixture (forming step); and
(c) sintering the obtained formed body (sintering step).

In addition, the sputtering target of the present invention may be prepared by a method including the following essential steps and the following optional steps.
(a) an essential step for mixing a crude oxide powder composed of at least indium oxide, gallium oxide, and zinc oxide (mixing step);
(a)' an optional step for heating the obtained mixture at 500 to 1200° C. for 1 to 100 hours (calcining step);
(b) an essential step for forming the obtained mixture (forming step);
(c) an essential step for sintering the obtained formed body (sintering step);
(d) an optional step for reducing the sintered body obtained by the sintering step (reducing step); and
(e) an optional step for processing the sintered body to a configuration suitable for loading the body to a sputtering device (processing step).

(a) Mixing Step

Mixing step is an essential step for mixing metal oxides used as crude materials for a sputtering target.

Crude materials may comprise metal oxides such as oxides of Indium element (In), Gallium element (Ga), Zinc element (Zn) and a metal element (X) having positive four or more valences.

The crude materials normally use powder such as indium oxide powder, zinc oxide powder, and gallium oxide powder, but an elementary substance thereof, a compound thereof or a composite oxide thereof may also be used as the crude materials.

A metal zinc powder (zinc powder) is preferably used as a part of the crude materials. If zinc powder is used as a part of the crude materials, appearance of White-spot can be inhibited.

An average diameter of a zinc compound a powder used as the crude material is preferably smaller than that of an indium compound powder. The average diameter of a metal oxide powder for the crude materials can be measured by a method described in JIS R 1619. Indium compounds include, for example, indium oxide and indium hydroxide. Zinc compounds include, for example, zinc oxide and zinc hydroxide. Oxide is preferable for each compound because of its ease of sintering or its rareness of remaining by-products.

Each of the above crude materials is mixed and ground by known mixing or grinding processes. Purity of each crude material is normally 99.9% (3N) or more, preferably 99.99% (4N) or more, further preferably 99.995% or more, and especially preferably 99.999% (5N) or more. If the purity of each crude material is 99.9% (3N) or more, properties of a semiconductor is not declined by impurities and thus credibility is sufficiently kept. Specifically, if Na content is less than 100 ppm, credibility at the time of making a thin-film transistor is preferably going up.

The above-mentioned crude oxide powder is mixed. The mixing is preferably conducted by using a normal mixing and grinding machine, for example, a wet-type ball mill, a beads mill or an ultrasonic device so as to mix and grind it uniformly. Average particle diameter of the mixture obtained after the mixing and grinding is usually 10 µm or less, preferably 1 to 9 µm, and especially preferably 1 to 6 µm. If the average particle diameter is 10 µm or less, density of a sputtering target to be obtained is preferably high. The average particle diameter can be determined by a method described in JIS R 1619.

Specific surface area of the crude oxide powder is, for example, 2 to 10 $m^2/g$, and preferably 4 to 8 $m^2/g$. The difference in the specific surface areas for each crude oxide powder is 5 $m^2/g$ or less, preferably 3 $m^2/g$. If the difference in the specific surface area is smaller, the crude oxide powder can be ground and mixed more efficiently, and especially, it is preferable that no gallium oxide particle is remained in an obtained oxide. In addition, it is preferable that the specific surface area for an indium oxide powder is substantially the same as that for a gallium oxide powder, so that the crude oxide powder can be ground and mixed more efficiently. In this connection, the specific surface area can be determined by, for example, BET method.

It is preferable that the crude material is a mixed powder comprising an oxide indium powder, an oxide gallium powder, a zinc powder or a complex oxide powder having the specific surface area of 3 to 16 $m^2/g$ in which the specific area of the whole powder is 3 to 16 $m^2/g$. The specific surface area of each oxide powder is preferably almost the same as one another. This crude material makes grinding and mixing more effectively. Specifically, a ratio of the specific surface area is preferably in ¼ to 4 times, especially preferably in ½ to 2 times.

The mixed powder is mixed and ground by, for example, a wet-type medium agitating mill. In this connection, the mixed powder is preferably ground so that the specific surface area after the grinding is 1.0 to 3.0 $m^2/g$ higher than that of the crude mixed powder, or so that an average median diameter after the grinding is around 0.6 to 1 µm. By using such a crude powder controlled by the above, an oxide sintered body having a high density can be obtained without any calcining step. A reducing step is also unnecessary.

It is preferable that increase in the specific surface area of the above-mentioned crude mixed powder is 1.0 $m^2/g$ or more, or that the average median diameter after grinding the crude mixed powder is 1 µm or less, since sintered density is sufficiently high. It is also preferable that increase in the specific surface area of the crude mixed powder is 3.0 $m^2/g$ or less, or that the average median diameter after grinding the crude mixed powder is 0.6 µm or more, since contamination (the amount of impurity contaminated) from grind devices during grinding is not increase.

The value of the specific surface area for each powder is determined by BET method. The value of the median diameter of grain size distribution for each powder is determined by a grain size distribution meter. These values can be adjusted by grinding the powder using a dry-type grinding method or a wet-type grinding method.

During the mixing and grinding, water or ethanol containing about 1 vol. % of polyvinyl alcohol (PVA) may be used as a medium.

Median diameter (d50) of the crude oxide powder is, for example, 0.5 to 20 µm, and preferably 1 to 10 µm. The median diameter (d50) of the crude oxide powder is preferably 0.5 µm or more so that sintered density is not reduced so as not to make any air vessels in a sintered body. The median diameter (d50) of the crude oxide powder is preferably 20 µm or less so that particle diameter of the sintered body is not increased.

(a)' Calcining Step

A method for preparing a sputtering target of the present invention may contain (a)' step for calcining the obtained mixture after the step (a).

In this calcining step, the mixture obtained by the above-mentioned (a) step is calcined. By the calcining, density of a sputtering target obtained at the end can be readily increased.

The mixture obtained by (a) step is desirably heated at 500 to 1200° C., preferably at 800 to 1200° C., for 1 to 100 hours, and preferably for 2 to 50 hours at the calcining step. Such a heating condition at 500° C. or more for 1 hour or more is desirable, since thermal decomposition of an indium compound, a zinc compound and a tin compound is sufficiently conducted. A heating condition at 1200° C. or less for 100 hours or less is also desirable, since particles rarely create a bulk.

The obtained calcined products are preferably ground before the following forming step and the sintering step. This grinding of the calcined products is preferably conducted by a ball mill, a roll mill, a palm mill, or a jet mill. Average particle diameter of the calcined products after the grinding is, for example, 0.01 to 3.0 μm, and preferably 0.1 to 2.0 μm. It is preferable that the average particle diameter of the calcined products is 0.01 μm or higher, since sufficient bulk specific gravity is retained, and it is easy to handling it. It is also preferable that the average particle diameter of the calcined products is 1.0 μm or less, since density of a sputtering target obtained at the end can be readily increased.

The average particle diameter of the calcined products can be determined by a method described in JIS R 1619.

(b) Forming Step

The forming step is a step of press forming the mixture of metal oxides (or the calcined products if the above calcining step is present) so as to make a formed body. By this step, the mixture (or calcined products) is formed in a configuration appropriate for a sputtering target. If there is a calcining step, micro powders of the obtained calcined products may be granulated and then formed in a desirable configuration by a press forming.

Forming processing which can be used in the present invention includes, for example, uniaxial compression, metal molding, casting forming, injection molding, and so on. In order to obtain a sintered body (a sputtering target) having high sintered density, forming by cold isostatic press (CIP) is preferable.

During the forming processing, a forming auxiliary agent such as polyvinyl alcohol, methyl cellulose, polywax, or oleic acid may be used.

The press forming may be conducted by wet-processes and dry-processes which were known in the art. The dry-processes include Cold Press method and Hot Press method. The press forming is conducted, for example, by filling an obtained mixed powder in a metal mold and press forming it by a Cold Press device. The press forming is also conducted at ambient temperature (25° C.), under 100 to 100000 kg/cm², and preferably 500 to 10000 kg/cm².

The Cold Press method and Hot Press method are explained in detail below. By the Cold Press method, a mixed powder is filled in a forming die to prepare a formed body and then the body is sintered. By the Hot Press method, a mixed powder is directly sintered in a forming die. In the Hot Press method, a mixed powder is directly sintered usually at 700 to 1000° C. for 1 to 48 hours, and preferably at 800 to 950° C. for 3 to 24 hours.

As for the Cold Press method of the dry-processes, a crude material obtained after a grinding step is dried by a spray dryer and so on, and then formed. The forming may be conducted by methods known in the art, for example, press forming, cold isostatic press, metal molding, casting forming, or injection molding. In order to obtain a sintered body (a sputtering target) having high sintered density, the forming is preferably conducted by a method accompany with cold isostatic press (CIP). During the forming processing, a forming auxiliary agent such as polyvinyl alcohol, methyl cellulose, polywax, or oleic acid may be used.

Next, a formed product obtained by the above is sintered and then provide a sintered body. The sintering is desirably conducted under oxygen atmosphere by flowing oxygen, or conducted under compression. By sintering under these conditions, zinc transpiration is inhibited, and a sintered body having no void (cavity) can be obtained. The sintered body produced by the above has high density so that fewer nodules or fewer particles are made. Therefore, an oxide semi-conductor film having excellent film properties is prepared.

Rate of temperature increase up to 1000° C. is preferably 30° C./hour or more, and rate of temperature decrease for cooling is preferably 30° C./hour or more. If the rate of temperature increase is 30° C./hour or more, decomposition of oxides does not progress, and no pinhole is appeared. If the rate of temperature decrease for cooling is 30° C./hour or more, the composition ratio of In or Ga does not change.

A filtering forming method (see Japanese published unexamined application No. 11-286002) is preferably used as the above-mentioned wet-processes. This filtering forming method uses a filtering forming die comprising a water-insoluble material which is used for obtaining a formed body by vacuum-pumping water out from ceramic crude material slurry. The body comprises a lower forming die having one or more drain holes, a filter having water flowable property in which filter is placed on the lower forming die, and a forming die flame which clips the filter from the upper side through a seal material for sealing it. Each of the lower forming die, the forming die flame, the sealing material and the filter is disassemblably structured. By using the filtering forming die which vacuum-pumps water in the slurry out only from the filter side, slurry containing mixed powder, ion-exchange water and an organic additive is prepared. This slurry is injected in the filtering forming die, and then a formed body is prepared by vacuum-pumping water in the slurry out only from the filter side. After the obtained ceramic formed body is dry-delipidated, the body is sintered.

In order to homogenize bulk resistance of the sintered body obtained by the dry- or wet-processes as a whole oxide, a reducing step is preferably contained. The applicable reducing step includes, for example, a method using a reducing gas, reduction by vacuum heating or reduction by an inert gas. The reducing process by a reducing gas may use hydrogen, methane, carbon monoxide, or a mixed gas containing these gases and oxygen. The reducing process by sintering in an inert gas may use nitrogen, argon, or a mixed gas containing these gases and oxygen. Temperature at the reducing step is usually 300 to 1200° C., and preferably 500 to 800° C. Time period for the reducing process is usually 0.01 to 10 hours, preferably 0.5 to 5 hours.

An oxide sintered body may become a target by processing such as grinding. Specifically, the sintered body is ground by a flat-surface grinding machine to make surface roughness Ra of it up to 5 μm. The surface roughness is preferably Ra≦0.3 μm, and especially preferably Ra≦0.1 μm. Furthermore, mirror-like finishing is provided on a sputter side of the target, and then average surface roughness Ra of it is preferably 1000 angstrom or less. The mirror-like finishing (grinding) may be conducted by known grinding techniques such as mechanical grinding, chemical grinding, mechanochemical grinding (combination of mechanical grinding and chemical grinding). For example, a fixed abrasive grain polisher (polish liquid: water) is used for polishing #2000 or more, or a free abrasive grain lap (abrasive: SiC paste, etc.) is used for lapping, and then the abrasive may be changed to a diamond paste so as to lap and obtain an end product. However, such a grinding method is not limited to the above.

A cleaning processing of a target may use air blow, flowing water cleaning, etc. Eliminating foreign substances by the air blow can be efficiently conducted by vacuuming air using a dust collector from the opposite side of a nozzle. Not only air blow or flowing water cleaning, but also ultrasonic cleaning may also be used. The ultrasonic cleaning is effectively conducted by a method of conducting multi-oscillation within frequency from 25 to 300 KHz. For example, it is preferable that the ultrasonic cleaning is conducted by multi-oscillating 12 kinds of frequency in every 25 KHz within frequency from 25 to 300 KHz.

Obtained oxide is then properly processed.

Processing step is an optional step of cutting processing a sintered body obtained by sintering it as stated above in an appropriate form so as to attach a sputtering device, and then loading an attaching device such as backing plates. Thickness of a sputtering target is usually 2 to 20 mm, preferably 3 to 12 mm, especially preferably 4 to 6 mm, and thus the oxide of the present invention should also be processed at the same thickness as the above. Plural of oxides are loaded to one backing plate (support) so as to be used as substantially one sputtering target. The surface thereof is preferably finished by #200 to 10,000 of diamond whetstone, and especially preferably finished by #400 to 5,000 of diamond whetstone. If #200 to 10,000 of diamond whetstone is used, it is preferable that the oxide does not break up.

After processing the oxide to form a sputtering target, the oxide is bonded to a backing plate (support), and then a sputtering target which can be used for loading on a film-forming device is obtained. The backing plate is preferably made of oxygen free copper. The bonding preferably uses Indium solder.

(c) Sintering Step

Sintering step is a step of sintering the formed body obtained by the above forming step.

Conditions of the sintering step are sintering under oxygen gas atmosphere, under ambient or compressed pressure, usually 1100 to 1600° C., preferably 1440 to 1600° C., more preferably 1460 to 1550° C., usually for 30 minutes to 360 hours, preferably 45 minutes to 15 hours, and more preferably 1 to 5 hours. If the sintering temperature is 1100° C. or more, density of a sputtering target is readily increased so that the sintering is conducted within an appropriate time period. If the sintering temperature is 1600° C. or less, less components preferably vaporize. If the sintering time period is 30 minutes or more, density of a sputtering target is readily increased. If the sintering time period is 360 hours or less, the sintering is conducted within an appropriate time period. When the sintering is conducted under oxygen gas atmosphere or oxygen gas atmosphere, density of a sputtering target is readily increased and appearance of abnormal discharge is preferably inhibited during sputtering. The oxygen gas atmosphere is an atmosphere where oxygen concentration is, for example, 10 to 1000%. The sintering can be conducted under ambient or compressed pressure. The compression is desirably, for example, 98000 to 1000000 Pa, and preferably 100000 to 500000 Pa.

Rate of temperature increase at the sintering is usually 20° C./min. or less, preferably 8° C./min. or less, more preferably 4° C./min. or less, further preferably 2° C./min. or less, and especially preferably 0.5° C./min. or less. If the rate is 20° C./min. or less, homologous crystal is sufficiently formed.

(d) Reducing Step

Reducing step is an optional step for conducting reducing process so as to homogenize bulk resistance of the sintered body obtained by the sintering step as a whole target.

Reducing methods applicable to the present step include, for example, a method for circulating a reducing gas, a method for sintering it in vacuum, and a method for sintering it in an inert gas.

The reducing gas may include, for example, hydrogen, methane, carbon monoxide, or a mixed gas containing these gases and oxygen.

The inert gas may include nitrogen, argon, or a mixed gas containing these gases and oxygen.

Temperature at the reducing step is usually 100 to 800° C., and preferably 200 to 800° C. Time period for the reducing process is usually 0.01 to 10 hours, preferably 0.05 to 5 hours.

Pressure of the reducing gas or the inert gas is, for example, 9800 to 1000000 Pa, preferably 98000 to 500000 Pa. When the sintering is conducted in vacuum, the vacuum specifically means around $10^{-1}$ to $10^{-8}$ Pa, preferably $10^{-2}$ to $10^{-5}$ Pa, and a residual gas may be argon, nitrogen, etc.

(e) Processing Step

Processing step is an optional step of cutting processing a sintered body obtained as the above sintering in an appropriate form so as to attach a sputtering device, and loading an attaching device such as backing plates. Thickness of a sputtering target is usually 2 to 20 mm, preferably 3 to 12 mm, especially preferably 4 to 6 mm. The surface of a sputtering target is preferably finished by #200 to 10,000 of a diamond whetstone, and especially preferably finished by #400 to 5,000 of a diamond whetstone. If #200 to 10,000 of diamond whetstone is used, it is preferable that the oxide does not break up. Plural of sputtering targets are loaded to one backing plate so as to be used as substantially one sputtering target. The backing plate is preferably made of oxygen free copper.

(3) Method for Producing a Thin Film (3-1) Forming of an Amorphous Oxide Thin Film By using a sputtering target of the present invention, an amorphous oxide thin film can be formed on a substrate by a sputtering method. Specifically, a step of (i) conducting sputtering using the sputtering target of the present invention under 25 to 450° C. of a film forming temperature is included. By this step, an amorphous oxide thin film having less than $1 \times 10^{18}/cm^3$ of an electric carrier concentration can be obtained.

The sputtering method may include a DC (direct current) sputter method, an AC (alternating current) sputter method, an RF (radio frequency) sputter method, a magnetron sputter method, an ion beam sputter method, etc. The DC (direct current) sputter method and the RF (radio frequency) sputter method are preferably used.

The film forming temperature during sputtering may differ based on sputtering methods, but for example 25 to 450° C., preferably 30 to 250° C., and more preferably 35 to 150° C. are desirable. The film forming temperature is a temperature of a substrate where a thin film is formed.

Pressure in a sputtering chamber at sputtering may differ based on sputtering methods, but for example, when a DC (direct current) sputter method is used, 0.1 to 2.0 MPa, and preferably 0.3 to 0.8 MPa are desirable. When an RF (radio frequency) sputter method is used, 0.1 to 2.0 MPa, and preferably 0.3 to 0.8 MPa are desirable.

Electric power output supplied at sputtering may differ based on sputtering methods, but for example, when a DC (direct current) sputter method is used, 10 to 1000 W, and preferably 100 to 300 W are desirable. When an RF (radio frequency) sputter method is used, 10 to 1000 W, and preferably 50 to 250 W are desirable.

Power supply frequency during the RF (radio frequency) sputter method, for example 50 Hz to 50 MHz, and preferably 10 k to 20 MHz are desirable.

A carrier gas at the sputtering may differ based on sputtering methods, but for example, oxygen, helium, argon, xenon, and krypton are included. A mixed gas of argon and oxygen is preferable. When the mixed gas of argon and oxygen is used, flow ratio of argon:oxygen of $Ar:O_2=100$ to 80:0 to 20, and preferably 99.5 to 90:0.5 to 10 are desirable.

The obtained amorphous film may be reduced, or the amorphous film may be prepared under reducing atmosphere, and then a conductive film may be obtained. That is, the target of the present invention can be used as a conductive film. The reducing may contain hydrogen plasma processing, nitrogen plasma processing, argon plasma processing, vacuum superheating, superheating under hydrogen atmosphere, or UV irradiation.

Prior to a sputtering, a sputtering target is adhered (bonding) on a support. This is for fixing a target to a sputtering device.

Sputtering is carried out using the bonded sputtering target to obtain an amorphous oxide thin film containing In, Ga and Zn oxides as major ingredients on a substrate. The "major ingredients" means that 60% or more in atom ratio of each of In, Ga and Zn elements is contained when total atom ratio of elements other than oxygen is 100 atom %.

Glass or resin (PET, PES, etc.) can be used as the substrate.

Film thickness of the obtained amorphous oxide thin film may differ based on film forming time or sputtering methods, but the thickness is for example, 5 to 300 nm, and preferably 10 to 90 nm.

Electric carrier concentration of the obtained amorphous oxide thin film is, for example, less than $1 \times 10^{18}/cm^3$, and preferably $5 \times 10^{17}$ to $1 \times 10^{12}/cm^3$.

Relative density of the obtained amorphous oxide thin film is desirably 6.0 $g/cm^3$ or more, and preferably 6.1 to 7.2 $g/cm^3$. If the thin film has such high density, the obtained oxide thin film has less creation of nodules or particles, and then an oxide thin film having excellent film properties may be obtained.

(3-2) Manufacturing a Thin Film Transistor

When a thin film transistor comprising the amorphous oxide thin film of the present invention and an oxide insulation layer is made, the following steps are appropriately included.

(ii) heat treating an amorphous oxide thin film of the present invention within oxidation atmosphere; and (iii) forming an oxide insulation layer on the heat treated amorphous oxide thin film.

In this connection, the heat treating is desirably conducted, for example, at 100 to 450° C., and preferably 150 to 350° C. for 0.1 to 10 hours, and preferably 0.5 to 2 hours in view of stability of semi-conductor properties.

The method of forming an oxide insulation layer on the heat treated amorphous oxide thin film may include a CVD method or a sputter method.

The oxide insulation layer may include, for example, $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN, etc. Among these oxides, $SiO_2$, $SiN_x$, $Al_2O_3$, $Y_2O_3$, $Hf_2O_3$, and $CaHfO_3$ are preferable, $SiO_2$, $SiN_x$, $Y_2O_3$, $Hf_2O_3$, and $CaHfO_3$ are more preferable; $SiO_2$, $Y_2O_3$, $Hf_2O_3$, and $CaHfO_3$ are especially preferable. Number of oxygen in these oxides does not always have to correspond to stoichiometric ratio (e.g. $SiO_2$ as well as $SiO_x$ are allowed). $SiN_x$ may contain hydrogen element.

A laminated structure containing two or more of insulation films is also applicable.

Although a crystalline material, a multi-crystalline material or an amorphous material may be used, a multi-crystalline material or an amorphous material each of which is readily produced is preferable. It is especially preferable that a protective layer is an amorphous material. If a protective layer is an amorphous material, interfacial smoothness is improved, high carrier mobility is kept, and neither threshold voltage nor S value becomes too high.

The S value (Swing Factor) is a value for indicating steepness of drain current which rises rapidly from OFF position to ON position when gate voltage is increased from Off position. As defined by the following formula, increment of gate voltage when drain current increases single digit (10 times) is S value.

$$S\ \text{value} = dVg/d\ \log(Ids)$$

Lower S value means high steepness in rising (cf. Yasuhiro Ukai, "Hakumaku-trangista gijutu no subete (All about Thin Film Transistor Technique)", Kogyo Chosa Kai, 2007). If S value is high, high gate voltage is required for switching from ON to OFF, and then there is possibility that electric power consumption becomes high.

S value is preferably 0.8V/dec or less, more preferably 0.3V/dec or less, further preferably 0.25V/dec or less, and especially preferably 0.2V/dec or less. If S value is more than 0.8V/dec, there is possibility that driving voltage becomes high and then electric power consumption also becomes high. Especially, when the thin film transistor is used for an organic light emitting display, because of direct current drive, S value is preferably 0.3V/dec or less so as to enormously reduce electric power consumption.

(3-3) Specific Making Method of a Thin Film Transistor

The following explanation is made by using a thin film transistor as an example with reference to FIG. 5.

Substrate (1) such as a grass substrate is prepared, and then Ti having thickness of 1 to 100 nm (a contact layer), Au having thickness of 10 to 300 nm (a connecting layer), and Ti having thickness of 1 to 100 nm (a contact layer) are laminated in this order. The laminated layers are formed a gate electrode (2) by a photo-lithography method and a lift-off method.

$SiO_2$ film having thickness of 50 to 500 nm is formed on the laminated layers by a TEOS-CVD method, and then a gate insulation film (3) is formed. A film forming method for a gate insulation film (12) may be a sputter method, but a CVD method such as a TEOS-CVD method or a PECVD method is preferable.

A sputtering target composed of the oxide of the present invention is used as a target, and then an amorphous oxide thin film (semi-conductor) composed of In—Ga—Zn—O oxide having thickness of 5 to 300 nm is deposited as a channel layer (4) by a RF sputter method. An element on which the obtained thin film is deposited is cut into an appropriate size, and then heat treatment is conducted under ambient pressure at 100 to 450° C. for 6 to 600 minutes. The obtained element is further laminated by Ti having thickness of 1 to 100 nm (a contact layer), Au having thickness of 10 to 300 nm (a connecting layer), and Ti having thickness of 1 to 100 nm (a contact layer) in this order to form a source electrode (5) and a drain electrode (6) by a photo-lithography method and a lift-off method. $SiO_2$ film having thickness of 50 to 500 nm is further formed on the laminated layers by a sputter method as a protective film (7). A method for film-forming a protective film (8) may be a CVD method. In this connection, by changing order of steps, making of a protective film as shown in FIGS. 6(1) and (2) (etching stopper) may be conducted prior to the preparation of the above source electrode and drain electrode.

(4) Utility of the Thin Film

The amorphous oxide thin film obtained above may be used as-is, or by heating treatment, used as a thin film transistor, a channel layer for a thin film transistor, or a semiconductor film of a solar cell or a gas sensor.

(4-1) The thin film transistor prepared by the present invention is explained below. The thin film transistor includes a substrate, a semi-conductor layer, a protective layer for a semi-conductor layer, a gate insulation film or an electrode.

Substrate

As for a substrate, any substrate known in the present technical field may be used without limitation. For example, a glass substrate such as alkaline silicate type glass, alkali-free glass, or quartz glass; a silicon substrate; a resin substrate such as acryl, polycarbonate, or polyethylene naphthalate (PEN); or a polymer film base material such as polyethylene terephthalate (PET) or polyamide can be used. Thickness of substrate or base material is usually 0.1 to 10 mm, preferably 0.3 to 5 mm. If a grass substrate is used, a chemically or thermally enhanced grass substrate is preferable. If transparency or smoothness is required, a glass substrate and a resin substrate are preferable, and a glass substrate is especially preferable. If weight saving is required, a resin substrate or a polymer base material is preferable.

Semi-Conductor Layer

A semi-conductor layer includes a composite oxide of In (indium), Zn (zinc), and Ga (gallium). Such a semi-conductor layer can be prepared, for example, by forming a thin film using a composite oxide target of the present invention (a target for a semi-conductor).

In the present invention, the semi-conductor layer is preferably an amorphous film. By using such an amorphous film, its contact property to an insulation film or a protective layer has improved, and then uniform transistor property can be easily obtained even if it is large area. Whether or not the semi-conductor layer is an amorphous film can be confirmed by X-ray crystal structure analysis. If no clear peak is monitored, the semi-conductor layer is amorphous.

Electric carrier concentration of the semi-conductor layer is preferably $10^{13}$ to $10^{18}/cm^3$, and especially preferably $10^{14}$ to $10^{17}/cm^3$. If electric carrier concentration is in the above range, the semi-conductor layer becomes readily a non-degeneration semi-conductor, and then balance between mobility and ON-OFF ratio is preferably improved when it is used as a transistor. Band gap is preferably 2.0 to 6.0 eV, and more preferably 2.8 to 5.0 eV. If the band gap is 2.0 eV or more, a field effect type transistor causes less improper operation by absorbing visible light. If the band gap is 6.0 eV or less, a field effect type transistor rarely lose its function by less supplement of carrier.

A semi-conductor layer is preferably a non-degeneration semi-conductor having thermal active property. If a non-degeneration semi-conductor is used, some disadvantages such as off-current and gate-leak current increase caused by excess of carrier, or normally-ON caused by negative threshold can be avoided. Whether or not the semi-conductor layer is a non-degeneration semi-conductor can be confirmed by measuring mobility and carrier density as a result of temperature changes using Hall effect. In order to make a semi-conductor layer being a non-degeneration semi-conductor, partial pressure for oxygen during preparing a film is adjusted, and carrier density is optimized by post treatment for controlling the number of oxygen defects.

Surface roughness of the semi-conductor layer (RMS) is preferably 1 nm or less, more preferably 0.6 nm or less, and especially preferably 0.3 nm or less. If RMS is 1 nm or less, mobility would not be reduced.

The semi-conductor layer is preferably an amorphous film maintaining at least a part of an edge-sharing structure in a bixbite structure of indium oxide. Whether the amorphous film containing indium oxide maintains at least a part of an edge-sharing structure in a bixbite structure of indium oxide may be confirmed by radial distribution function (RDF) obtained by Grazing Incidence X-ray Scattering (GIXS) in which a peak showing In—X (X is In or Zn) is in 0.3 to 0.36 nm (specifically, see F. Utsuno, et al., Thin Solid Films, Volume 496, 2006, pp. 95-98).

Assuming that the maximum value of RDF where atomic distance is between 0.30 and 0.36 nm is A, and that the maximum value of RDF where atomic distance is between 0.36 and 0.42 is B, A/B>0.7 is preferable, A/B>0.85 is more preferable, A/B>1 is further preferable, and A/B>1.2 is especially preferable.

If A/B is 0.7 or more, mobility is rarely reduced, and threshold or S value is rarely increased too high. Small A/B seems to reflect poor short distance orderliness in an amorphous film.

Average bond distance of In—In is preferably 0.3 to 0.322 nm, and especially preferably 0.31 to 0.32 nm. Average bond distance of In—In can be measured by X-ray absorption spectroscopy. The measurement by the X-ray absorption spectroscopy shows extended X-ray absorption fine structure (EXAFS) expanded from rising to a high energy portion such as several hundred eV higher. EXAFS is caused by backscattering of electrons by atoms surrounding excited atoms. Interference effect between releasing electron wave and backscattered wave is occurred. The interference depends on wavelength of electron state, and light path length traversing between surrounding excited atoms. Radial distribution function (RDF) is obtained by conducting Fourier transform of EXAFS. Average bond distance can be estimated from RDF peak.

Film thickness of the semi-conductor layer is normally 0.5 to 500 nm, preferably 1 to 150 nm, more preferably 3 to 80 nm, and especially preferably 10 to 60 nm. If the thickness is 0.5 nm or more, industrial, uniform film forming is possible. If the thickness is 500 nm or less, film forming time is not too long. If the thickness is between 3 and 80 nm, TFT properties such as mobility or ON-OFF ratio are especially improved.

Preferred embodiment of the present invention is that the semi-conductor layer is an amorphous film, and that energy width ($E_0$) of delocalized level is 14 meV or less. The energy width ($E_0$) of delocalized level of the semi-conductor layer is preferably 10 meV or less, more preferably 8 meV, and especially preferably 6 meV. If the energy width ($E_0$) of delocalized level is 14 meV or less, and if the semi-conductor layer is used as an active layer for a transistor, mobility is rarely reduced, and threshold or S value is rarely increased too high. High energy width ($E_0$) of delocalized level of the semi-conductor layer seems to reflect poor short distance orderliness in an amorphous film.

Semi-Conductor Layer

The thin film transistor preferably has a protective layer of a semi-conductor. If there is a protective layer of a semi-conductor, oxygen in a surface layer of a semi-conductor is not left even under vacuum or low pressure, off-current is not increased, and threshold voltage does not become negative. There is no environmental effect such as humidity even under atmospheric pressure, and there is no risk of increasing variation in transistor properties such as threshold voltage.

There is no limitation for selecting material to form the protective layer of a semi-conductor. Any material commonly used may be chosen unless feature of the present invention is lost. For example, $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN, etc. Among these oxides, $SiO_2$, SiNx, $Al_2O_3$, $Y_2O_3$, $Hf_2O_3$, and $CaHfO_3$ are preferably used; $SiO_2$, SiNx, $Y_2O_3$, $Hf_2O_3$, and $CaHfO_3$ are more preferable; $SiO_2$, $Y_2O_3$, $Hf_2O_3$, and $CaHfO_3$ are especially preferable. Number of oxygen in these oxides does not always have to correspond to stoichiometric ratio (e.g. $SiO_2$ as well as SiOx are allowed). SiOx may contain hydrogen element.

Such a protective film may have a laminated structure containing two or more different kinds of insulation film. The protective film may be a crystalline material, a multi-crystalline material or an amorphous material. A multi-crystalline material or an amorphous material each of which is readily, industrially produced is preferable. It is especially preferable that the protective layer is an amorphous material. If a protective layer is an amorphous material, interfacial smoothness is improved, mobility is not lowered, and neither threshold voltage nor S value becomes too high.

The protective layer of a semi-conductor layer is preferably an amorphous oxide or an amorphous nitride, and an amorphous oxide is especially preferable. If the protective layer is an oxide, oxygen in a semi-conductor does not transfer to a protective layer side, OFF current does not become high, and there is no risk to show normally-OFF caused by negative threshold voltage. The protective layer of the semi-conductor layer may use an organic insulation film such as poly-(4-vinylphenol) (PVP), or parylene. The protective layer of the semi-conductor layer may have two or more layer-laminated structure including an inorganic insulation film and an organic insulation film.

Gate Insulation Film

There is no limitation for selecting material to form the gate insulation film. Any material commonly used may be chosen unless feature of the invention related to the present embodiment is lost. For example, $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN, etc. Among these oxides, $SiO_2$, SiNx, $Al_2O_3$, $Y_2O_3$, $Hf_2O_3$, and $CaHfO_3$ are preferably used; $SiO_2$, SiNx, $Y_2O_3$, $Hf_2O_3$, and $CaHfO_3$ are more preferable. Number of oxygen in these oxides does not always have to correspond to stoichiometric ratio (e.g. $SiO_2$ as well as SiOx are allowed). SiOx may contain hydrogen element.

Such a gate insulation film may have a laminated structure containing two or more different kinds of insulation film. The gate insulation film may be a crystalline material, a multi-crystalline material or an amorphous material. A multi-crystalline material or an amorphous material each of which is readily, industrially produced is preferable. The gate insulation film may use an organic insulation film such as poly-(4-vinylphenol) (PVP), or parylene. The gate insulation film may have two or more layer-laminated structure including an inorganic insulation film and an organic insulation film.

Electrode

There is no limitation for selecting material to form each electrode such as a gate electrode, a source electrode, and a drain electrode. Any material commonly used may be chosen unless feature of the present invention is lost.

For example, the material includes a transparent electrode such as indium tin oxide (ITO), indium zinc oxide, ZnO, or $SnO_2$; a metal electrode such as Al, Ag, Cr, Ni, Mo, Au, Ti, Ta, or Cu; or an alloyed metal electrode contained thereof. These materials are preferably laminated two or more layers to reduce contact resistance, and to enhance interface strength. In order to reduce contact resistance of a source electrode and a drain electrode, the interface between them and an electrode of a semi-conductor may be subject to plasma treatment and ozone treatment so as to control their resistance.

(4-2) Method for Making a Thin Film Transistor (a Field Effect Type Transistor)

The making method of the present invention is characterized by using the sputtering target of the above-mentioned present invention, and by comprising a step for forming a semi-conductor layer and a step for heat-treating it at 70 to 350° C. after forming the semi-conductor layer.

In this connection, each contractual element (layer) of the above-mentioned thin film transistor may be formed by any method known in the present technical field.

Specifically, a film forming method includes a chemical film forming method such as a spray method, a dip method, or a CVD method; and a physical film forming method such as a sputter method, a vacuum deposition method, an ion plating method, or a pulse laser deposition method. A physical film forming method is preferable, since carrier density is readily controlled and film quality is easily improved. A sputter method is more preferable because of its high productivity.

Sputtering includes a method using a sintered target of a composite oxide, a method using a cosputter by multiple sintered targets, and a method using a reactive sputter by an alloy target. A sintered target of a composite oxide is preferably used. RF, DC or AC sputtering known in the art is also useful. DC or AC sputtering is preferable in view of uniformity and mass productivity (facility costs).

The formed film may be subject to patterning by several etching methods.

In the present invention, a semi-conductive film is preferably formed using the target of the present invention by DC or AC sputtering. By using DC or AC sputtering, damage at the film forming can be reduced in comparison with an RF sputtering. Therefore, in a case with a field effect type transistor, reduction of threshold voltage shift, enhancement of mobility, reduction of threshold voltage, reduction of S value and so on can be expected.

In the present invention, heat treatment is preferably conducted at 70 to 350° C. after film forming of a semi-conductor layer. Especially, the heat treatment is preferably conducted at 70 to 350° C. after forming a semi-conductor layer and a protective layer of the semi-conductor layer. If the temperature is 70° C. or more, the obtained transistor may keep its sufficient heat stability, heat resistance, and sufficient mobility, and there is no risk to become S value or threshold voltage too high. If the temperature is 350° C. or less, a substrate having no heat resistance can be used, and facility cost for heat treatment is not necessary.

Heat treating temperature is more preferably 80 to 260° C., further preferably 90 to 180° C., and especially preferably 100 to 150° C. Specifically, if the heat treating temperature is 180° C. or less, it is preferable because a resin substrate having low heat resistance such as PEN can be used as a substrate.

Heat treating time is usually preferably 1 second to 24 hours, but it is also preferable that the heat treating time is controlled based on treating temperature. For example, when the temperature is from 70 to 180° C., 10 minutes to 24 hours is more preferable, 20 minutes to 6 hours is further preferable, and 30 minutes to 3 hours is especially preferable. When the temperature is from 180 to 260° C., 6 minutes to 4 hours is more preferable, and 15 minutes to 2 hours is especially preferable. When the temperature is from 260 to 300° C., 30 seconds to 4 hours is more preferable, and 1 minute to 2 hours is especially preferable. When the temperature is from 300 to 350° C., 1 second to 1 hour is more preferable, and 2 seconds to 30 minutes is especially preferable.

Heat treatment is preferably conducted in an inert gas under $10^{-3}$ Pa or less of oxygen partial pressure, or after a semi-conductor layer is covered with a protective layer. If either of conditions is selected, reproducibility is improved.

(4-3) Thin Film Transistor Properties

In the thin film transistor of the present invention, mobility is preferably 1 $cm^2$/Vs or more, more preferably 3 $cm^2$/Vs or more, and especially preferably 8 $cm^2$/Vs or more. If the mobility is 1 $cm^2$/Vs or more, switching rate does not become slow, and then the transistor is preferably used for big-screen, high-fineness display.

ON-OFF rate is preferably $10^6$ or more, more preferably $10^7$ or more, and especially preferably $10^8$ or more.

OFF current is preferably 2 pA or less, and more preferably 1 pA or less. If the OFF current is 2 pA or less, sufficient contrast is obtained and excellent uniformity of display is also obtained when the transistor is used for TFT of the display.

Gate-leak current is preferably 1 pA or less. If the gate-leak current is 1 pA or more, excellent contrast is obtained when the transistor is used for TFT of the display.

Threshold voltage is usually 0 to 10V, preferably 0 to 4V, more preferably 0 to 3V, and especially preferably 0 to 2V. If the threshold voltage is 0V or more, normally-ON is avoided, no voltage is needed during OFF, and then electric power consumption can be kept lower. If the threshold voltage is 10V or more, driving voltage can be kept lower, electric power consumption can be kept lower, and mobility can also be kept lower.

S value is preferably 0.8V/dec or less, more preferably 0.3V/dec or less, further preferably 0.25V/dec or less, and especially preferably 0.2V/dec or less. If S value is 0.8V/dec or less, driving voltage does not become higher and then electric power consumption becomes lower. Especially, when the transistor is used for an organic light emitting display, because of direct current drive, if S value is 0.3V/dec or less, electric power consumption is preferably and enormously reduced.

Threshold voltage shift between before and after applying 10 μA of direct current voltage at 50° C. for 100 hours is preferably 1.0V or less, and more preferably 0.5V or less. If the shift is 1.0V or less, image quality does not change if the transistor is used for a transistor of an organic light emitting display.

Smaller hysteresis during gate voltage being up and down in transfer curve is preferable.

Ratio of channel width (W) and channel length (L) (W/L) is normally 0.1 to 100, preferably 0.5 to 20, and especially preferably 1 to 8. If W/L is 100 or less, leak current does not increase, ON-OFF ratio would be lowered. If W/L is 0.1 or more, field effect mobility is not lowered, and pinch off becomes clear. The channel length (L) is normally 0.1 to 1000 μm, preferably 1 to 100 μm, and more preferably 2 to 10 μm. If the channel length (L) is 0.1 μm or more, there is no possibility to become industrial manufacture difficult and to become leak current higher. If the channel length (L) is 1000 μm or less, an element does not become too big.

The field effect type transistor of the present invention preferably has a structure for shading a semi-conductor layer. If there is a structure for shading a semi-conductor layer (e.g. a shading layer), there is no possibility to excite a carrier electron when light comes in the semi-conductor layer and then to become OFF current higher. The shading layer preferably includes a thin film having absorption between 300 nm and 800 nm. The shading layer may be located on either upper or lower portion of the semi-conductor layer, but the shading layer is preferably located on both upper and lower portions. The shading layer may also be used as a gate insulation film and a black matrix. If the shading layer is present only on one side, it is necessary to improve its structure not to radiate light to a semi-conductor layer from another side where no shading layer is present.

The field effect type transistor of the present invention may have a contact layer between a semi-conductor layer and a source electrode or a drain electrode. The contact layer preferably has lower resistance than that of a semi-conductor layer. Forming materials of the contact layer may include a composite oxide having similar composition to that of the above-mentioned semi-conductor layer. That is, the contact layer preferably contains each element such as In, Zn or Zr. If these elements are included, transfer of elements between the contact layer and the semi-conductor layer is not occurred, and threshold voltage shift during stress test, etc. does not become too big.

There is not limitation for a preparation method of the contact layer, but a contact layer having the same composition ratio as that of the semi-conductor layer may be formed by changing film forming conditions; a layer having different composition ratio from that of the semi-conductor layer may be formed; a layer may be constructed by heightening resistance at a portion contacting with an electrode of the semi-conductor by plasma treatment or ozone treatment; or a layer having higher resistance by varying film forming conditions such as partial pressure for oxygen may be formed during forming a semi-conductor. The field effect type transistor of the present invention preferably contains an oxygen resistance layer having a resistance higher than that of the semi-conductor layer between a semi-conductor layer and a gate insulation layer, and/or between a semi-conductor layer and a protective layer. If there is an oxide resistance layer, OFF current is not detected, normally-ON caused by negative threshold can be avoided, and there is no deterioration on properties caused by changing semi-conductor's quality during post-treating step such as forming a protective film or etching.

The oxide resistance layer may include as follows.

an amorphous oxide film having the same composition ratio as that of the semi-conductor layer which film is formed under a higher partial pressure of oxygen than that during forming the semi-conductor layer an amorphous oxide film having the same composition as that of the semi-conductor layer but having different composition ratio from that of the semi-conductor layer an amorphous oxide film containing not only In and Zn but also element X which is different from that in the semi-conductor layer a multi-crystalline oxide film containing indium oxide as a major component a multi-crystalline oxide film containing indium oxide as a major component, which film is doped by one or more positive bivalent elements such as Zn, Cu, Co, Ni, Mn, or Mg If the amorphous oxide film having the same composition as that of the semi-conductor layer but having different composition ratio from that of the semi-conductor layer, or the amorphous oxide film containing not only In and Zn but also element X which is different from that in the semi-conductor layer, In composition ratio is preferably less than that of the semi-conductor layer. The composition ratio for the element X is preferably higher than that of the semi-conductor layer.

The oxide resistance layer is preferably an oxide containing In and Zn. If these elements are contained, transfer of elements between the oxide resistance layer and the semiconductor layer is not occurred, and threshold voltage shift during stress test, etc. does not become too big.

Although examples of the present invention are shown as follows, the following examples do not intend to limit the scope of the present invention.

EXAMPLES

Example 1

Each powder of $In_2O_3$ (made by Kojundo Chemical Laboratory, Co., 99.99% purity), $Ga_2O_3$ (made by Kojundo Chemical Laboratory, Co., 99.99% purity), and ZnO (made by Kojundo Chemical Laboratory, Co., 99.99% purity) was weighed to meet atom ratio of metals contained in a mixed powder being In:Ga:Zn=1:1:1. Each weighed powder was added to a 500 ml polyamide container, 200 g of zirconia beads having 2 mm in diameter were further added, ethanol was also added as a disperse media, and then wet-mixing was conducted using a planetary ball mill device provided by Fritz Japan for one hour. The obtained mixture was calcined in an alumina crucible under ambient pressure at 1000° C. for 5 hours, then unraveled using the planetary ball mill device again for 1 hour, and then obtained a ground, calcined product having an average diameter (JIS R 1619) of 3 µm. Thus prepared calcined product was formed in a disc configuration having 20 mm in diameter and 6 mm in thickness by a uniaxial pressing (100 kg/cm$^2$). The obtained formed body was sintered under ambient pressure at 1500° C. for 2 hours, and then obtained an oxide sintered body. Rate of temperature increase is 3° C./minutes. The obtained sintered body was further reduced under argon atmosphere at 800° C. for 2 hours, and then an oxide sintered body was obtained.

X-ray diffraction was used for structure analysis of the obtained product. The obtained product was confirmed as one composed of $InGaZnO_4$ ($InGaO_3(ZnO)$) of JCPDS Card No. 38-1104 and $In_2Ga_2ZnO_7$ (($InGaO_3$)$_2$ZnO) of JCPDS Card No. 38-1097. A chart of X-ray diffraction is shown in FIG. 1. When the maximum peak strength for the oxide crystal represented by $InGaZnO_4$ is P(1), and when the maximum peak strength for the oxide crystal represented by $In_2Ga_2ZnO_7$ is P(2), the peak strength ratio P(1)/P(2) was 0.9.

Example 2

As crude powders, Indium oxide powder having 6 m$^2$/g of specific surface area, gallium oxide powder having 6 m$^2$/g of specific surface area, and zinc oxide powder having 5 m$^2$/g of specific surface area were weighed to meet mass ratio of 45:30:25. Further, Ge as a positive quadrivalent metal was added to be an amount of 500 ppm, and then mixed and ground using a wet-type medium agitating mill. Zirconia beads having 1 mmϕ was used as a medium. Specific surface area of the ground powders was increased 2 m$^2$/g compared to that of the crude mixed powders. The obtained mixed powders were dried by using a spray dryer, then filled in a metal mold, and then press formed by a cold press device. Sintering was then conducted by flowing oxygen under oxygen atmosphere at 1500° C. for 2 hours. Based on the above steps, an oxide sintered body for a sputtering target having 6.2 g/cm$^2$ of sintered body density was obtained without calcining step.

The obtained product was confirmed by X-ray diffraction as one having crystals of $InGaZnO_4$ of JCPDS Card No. 38-1104 and $In_2Ga_2ZnO_7$ of JCPDS Card No. 38-1097. When the maximum peak strength for the oxide crystal represented by $InGaZnO_4$ is P(1), and when the maximum peak strength for the oxide crystal represented by $In_2Ga_2ZnO_7$ is P(2), the peak strength ratio P(1)/P(2) was 0.95. In addition, based on a shift of interstitial distance calculated from X-ray diffraction, and based on structural analysis using high brightness emitted light, it could be estimated that a part of In or Ga was replaced by Ge.

From an analysis of EPMA, the average particle diameter for each crystal of $InGaZnO_4$ and $In_2Ga_2ZnO_7$ was confirmed as 20 µm or less.

Example 3

The same sintering process was conducted as that of Example 2 except that Sn was used in place of the quadrivalent or more metal.

Under X-ray diffraction, when the maximum peak strength for the oxide crystal represented by $InGaZnO_4$ (JCPDS Card No. 38-1104) is P(1), and when the maximum peak strength for the oxide crystal represented by $In_2Ga_2ZnO_7$ (JCPDS Card No. 38-1097) is P(2), the peak strength ratio P(1)/P(2) was 1.3. In addition, based on a shift of interstitial distance calculated from X-ray diffraction, and based on structural analysis using high brightness emitted light, it could be found that a part of In or Ga was replaced by Sn.

Example 4

The same sintering process was conducted as that of Example 2 except that Zn was used in place of the quadrivalent or more metal.

Under X-ray diffraction, when the maximum peak strength for the oxide crystal represented by $InGaZnO_4$ (JCPDS Card No. 38-1104) is P(1), and when the maximum peak strength for the oxide crystal represented by $In_2Ga_2ZnO_7$ (JCPDS Card No. 38-1097) is P(2), the peak strength ratio P(1)/P(2) was 1.1. In addition, based on a shift of interstitial distance calculated from X-ray diffraction, and based on structural analysis using high brightness emitted light, it could be found that a part of In or Ga was replaced by Zr.

Example 5

The same sintering process was conducted as that of Example 3 except that mass ratio of indium oxide powder, gallium oxide powder and zinc oxide powder was 39:26:35. Under X-ray diffraction, when the maximum peak strength for the oxide crystal represented by $InGaZnO_4$ is P(1), and when the maximum peak strength for the oxide crystal represented by $InGaZn_2O_5$ is P(3), the peak strength ratio P(1)/P(3) was 1.1.

Example 6

$InGaZnO_4$ and $In_2Ga_2ZnO_7$ crystals were synthesized by methods of the non-patent documents 1 and 2. These crystals were mixed in a ratio of 1:1, sintered by SPS, and then obtained an oxide sintered body for a sputtering target having 6.2 g/cm$^2$ of sintered body density. Thus obtained oxide sintered body was confirmed by X-ray diffraction as one having crystals of $InGaZnO_4$ of JCPDS Card No. 38-1104 and $In_2Ga_2ZnO_7$ of JCPDS Card No. 38-1097.

Example 7

$InGaZnO_4$ and $InGaO_3(ZnO)_2$ crystals were synthesized by methods of the non-patent documents 1 and 2. These crystals were mixed in a ratio of 1:1, sintered by SPS, and then obtained an oxide sintered body for a sputtering target having 6.1 g/cm² of sintered body density. Thus obtained oxide sintered body was confirmed by X-ray diffraction as one having crystals of $InGaZnO_4$ and $InGaO_3(ZnO)_2$.

Example 8

$InGaZnO_4$, $InGaO_3(ZnO)_2$ and $In_2O_3(ZnO)_3$ crystals were synthesized by methods of the non-patent documents 1 and 2. These crystals were mixed in a ratio of 1:1:1, sintered by SPS, and then obtained an oxide sintered body for a sputtering target having 6.0 g/cm² of sintered body density. Thus obtained oxide sintered body was confirmed by X-ray diffraction as one having crystals of $InGaZnO_4$ $InGaO_3(ZnO)_2$ and $In_2O_3(ZnO)_3$.

Example 9

$InGaZnO_4$ crystal and $InAlZnO_4$ crystal were synthesized by methods of the non-patent documents 1 and 2. These crystals were ground, mixed in a ratio of 4:1, sintered by SPS, and then obtained an oxide sintered body for a sputtering target having 6.1 g/cm² of sintered body density. Thus obtained oxide sintered body was confirmed by X-ray diffraction as one having crystals of $InGaZnO_4$ crystal and $InAlZnO_4$.

Under X-ray diffraction, when the maximum peak strength for the oxide crystal (m=1) represented by $InGaZnO_4$ is P(3), and when the maximum peak strength for the oxide crystal (m=0.5) represented by $InAlZnO_4$ is P(4), the peak strength ratio P(3)/P(4) was 3.9.

Example 10

$InGaZnO_4$ and $InAlO_3(ZnO)_2$ crystals were synthesized by methods of the non-patent documents 1 and 2. These crystals were ground, mixed in a ratio of 4:1, sintered by SPS, and then obtained an oxide sintered body for a sputtering target having 6.1 g/cm² of sintered body density. Thus obtained oxide sintered body was confirmed by X-ray diffraction as one having crystals of $InGaZnO_4$ crystal and $InAlO_3(ZnO)_2$.

Examples 11 to 13 were prepared and evaluated by the same manner as Example 2 except for changing composition ratio, and shown in Table 1.

Examples 14 and 15 were prepared and evaluated by the same manner as Example 1 except for changing sintering temperature to 1450° C. and 1520° C. respectively, and shown in Table 1.

Example 16 was prepared and evaluated by the same manner as Example 1 except for changing sintering time to 4 hours, and shown in Table 1.

Comparative Example 1

As crude powders, Indium oxide powder having 6 m²/g of specific surface area, gallium oxide powder having 6 m²/g of specific surface area, and zinc oxide powder having 5 m²/g of specific surface area were weighed to meet mass ratio of 45:30:25, then mixed and ground using a wet-type medium agitating mill. Zirconia beads having 1 mmφ was used as a medium. Specific surface area of the ground powder was increased 2 m²/g compared with that of the crude mixed powder. The obtained mixed powder was dried by using a spray dryer, filled in a metal mold, and then press formed by a cold press device. Sintering was then conducted by flowing oxygen under oxygen atmosphere at 1400° C. for 2 hours. An oxide sintered body for a sputtering target having 5.9 g/cm² of sintered body density was obtained. The obtained sintered body was confirmed by X-ray diffraction as one having a crystal of $InGaZnO_4$ of JCPDS Card No. 38-1104. Although some peaks (peaks having 2θ being around 30, 36, 57, 63° C., etc.) which are estimated as the presence of a spinel structure shown by $ZnGa_2O_4$ are scantly found, quite few peaks related to metal oxides other than $InGaZnO_4$ are observed. Therefore, a sintered body containing $InGaZnO_4$ as a main ingredient was obtained. X-ray diffraction chart is shown in FIG. 2.

Comparative Example 2

Each powder of $In_2O_3$ (made by Kojundo Chemical Laboratory, Co., 99.99% purity), $Ga_2O_3$ (made by Kojundo Chemical Laboratory, Co., 99.99% purity), and ZnO (made by Kojundo Chemical Laboratory, Co., 99.99% purity) was weighed to meet atom ratio of metals contained in a mixed powder of In:Ga:Zn=1:1:1. The weighed powders were added to a 500 ml polyamide container, 200 g of zirconia beads having 2 mm in diameter were further added, and then wet-mixing was conducted using a planetary ball mill device provided by Fritz Japan for one hour. Ethanol was used as a disperse media. Each mixed powder was calcined in an alumina crucible under ambient pressure at 1000° C. for 5 hours, and then unraveled using the planetary ball mill device again for 1 hour. Thus prepared calcined powder was formed in a disc configuration having 20 mm in diameter by a uniaxial pressing (100 kg/cm²), and then sintered under ambient pressure at 1400° C. for 2 hours to obtain a sintered body. The obtained sintered body was further heated under argon atmosphere at 880° C. for 2 hours. The obtained sintered body was confirmed by X-ray diffraction as one having a crystal of $InGaZnO_4$ of JCPDS Card No. 38-1104. As the same manner as that of Comparative Example 1, although some peaks which are estimated for the presence of a spinel structure shown by $ZnGa_2O_4$ are scantly found, quite few peaks related to metal oxides other than $InGaZnO_4$ are observed. Therefore, as is the case with Comparative Example 1, a sintered body containing $InGaZnO_4$ as a main ingredient was obtained. Based on a shift of interstitial distance calculated from X-ray diffraction, and based on structural analysis using high brightness emitted light, it could not be found that any replacement from In to a positive quadrivalent element was occurred.

Comparative Example 3

Each powder of $In_2O_3$ (made by Kojundo Chemical Laboratory, Co., 99.99% purity), $Ga_2O_3$ (made by Kojundo Chemical Laboratory, Co., 99.99% purity), and ZnO (made by Kojundo Chemical Laboratory, Co., 99.99% purity) was weighed to meet atom ratio of metals contained in a mixed powder of In:Ga:Zn=2:2:1. The weighed powders were added to a 500 ml polyamide container, 200 g of zirconia beads having 2 mm in diameter were further added, and then wet-mixing was conducted using a planetary ball mill device provided by Fritz Japan for one hour. Ethanol was used as a disperse media. Each mixed powder was calcined in an alumina crucible under ambient pressure at 1000° C. for 5 hours, and then unraveled using the planetary ball mill device again for 1 hour. Thus prepared calcined powder was formed in a disc configuration having 20 mm in diameter by a uniaxial pressing (100 kg/cm²), and then sintered under ambient pressure at 1400° C. for 2 hours to obtain a sintered body. The obtained sintered body was further heated under argon atmosphere at 880° C. for 2 hours. The obtained sintered body was confirmed by X-ray diffraction as one having a crystal of $In_2Ga_2ZnO_7$ of JCPDS Card No. 38-1097. X-ray diffraction chart is shown in FIG. 3.

[Estimation of Oxide Sintered Body]

Composition

Atom % of elements contained in the oxide sintered body of the Examples and Comparative examples such as Indium element (In), Gallium element (Ga), Zinc element (Zn), or a metal element (X) having positive four or more valences was determined from element ratio obtained by ICP method and then calculated from the total amount thereof as 100%.

Crystal Phase

Crystal structure of the obtained oxide sintered body was confirmed by X-ray diffraction. Conditions for the X-ray diffraction are as follows.

Device; RIGAKU Co., Ultima-III

X-ray: Cu—Kα-ray (Wave length 1.5406 Å, monochromated by a graphite monochromator)

2θ-θ reflection method, continuous scanning (1.0°/min.)

Sampling interval; 0.02°

Slit DS, SS; 2/3°, RS: 0.6 mm

X-ray charts of Example 1, Comparative Example 1 and Comparative Example 3 are shown as representative X-ray charts in FIGS. 1 to 3. As shown in FIG. 1, with respect to the crystal structure of the oxide sintered body of Example 1, since $InGaZnO_4$ $(InGaO_3(ZnO)_1)$ of JCPDS Card No. 38-1104 and $In_2Ga_2ZnO_7$ of JCPDS Card No. 38-1097 correspond to the chart of FIG. 1, it can be confirmed that Example 1 relates to an oxide sintered body comprising an $InGaZnO_4$ $(InGaO_3(ZnO)_1)$ crystal phase indicating $InMO_3(ZnO)_m$ type crystal structure and an $In_2Ga_2ZnO_7$ crystal phase indicating a $(YbFeO_3)_2FeO$ type crystal structure.

From these charts, peak strength ratio (%) of crystalline phases of Examples and Comparative Examples were obtained. Specifically, based on X-ray diffraction, a maximum peak strength for the oxide crystal represented by $InGaZnO_4$ is set as P(1), and a maximum peak strength for the oxide crystal phase represented by $In_2Ga_2ZnO_7$ is set as P(2), then a peak strength ratio of P(1)/P(2) is obtained. In this connection, the maximum peak strength is strength at an angle where JCPDS pattern identified by each crystal shows maximum strength.

Appearance

Appearance was determined by observing it by the naked eye, using followings;

When White-spot is observed: X

When White-spot is partially observed: Δ

When no White-spot is observed: ○

Relative Density

The relative density of the present oxide was obtained from theoretical density calculated from density of a crude powder and density of a sintered body determined by Archimedes method using the following formula.

Relative Density=(Density determined by Archimedes method)/(Theoretical Density)×100(%)

Bulk Resistance

Bulk resistance of the oxide of the present invention was determined by a resistance meter (Mitsubishi chemical Co., LORESTA) using four-point probe method (JIS 1637). The bulk resistance was calculated from an average value taken from 10 locations.

Uniformity of the resistance was determined by measuring bulk resistance at 10 locations on the identical target surface, and then obtained a ratio between maximum value and minimum value (maximum value/minimum value). Evaluation was conduct based on 4 levels, from those having excellent uniformity, up to 5:, up to 10: ○, up to 20:, and more than 20: x.

Pinhole

Number of pinholes was evaluated by horizontal Feret diameter. Specifically, oxides obtained from Examples and Comparative Examples were ground, fracture surface thereof was polished using #2000 sand paper by a rotating polishing machine until the surface became mirror condition, and then SEM image of the fracture surface was obtained under magnification ratio of 100 times. This SEM image was conducted under binary image processing to specify pinholes, and then number of pinholes having horizontal Feret diameter of 2 μm or more located within 1 mm×1 mm square was counted by using an image processing software (particle analysis III, A.I. Soft Co.).

Evaluation results are shown in Tables 1 and 2.

TABLE 1

| | | EXAMPLES | | | | | | |
|---|---|---|---|---|---|---|---|---|
| | | 1 | 2 | 3 | 4 | 5 | 6 | 7 |
| | | METHOD FOR PRODUCING A TARGET | | | | | | |
| | | SINTERED | SINTERED | SINTERED | SINTERED | SINTERED | SPS | SPS |
| TOTAL COMPOSITION | In/(In + Zn + Ga) | 0.34 | 0.34 | 0.34 | 0.34 | 0.28 | 0.37 | 0.29 |
| RATIO OF SINTERED | Zn/(In + Zn + Ga) | 0.32 | 0.32 | 0.32 | 0.32 | 0.44 | 0.26 | 0.42 |
| BODY | Ga/(In + Zn + Ga) | 0.34 | 0.34 | 0.34 | 0.34 | 0.28 | 0.37 | 0.29 |
| METAL HAVING FOR | METALS | — | Ge | Sn | Zr | Ge | — | — |
| OR MORE VALENCES | CONTENT(ppm) | — | 500 | 500 | 500 | 500 | — | — |
| IN SINTERED BODY | | | | | | | | |
| X-RAY | InGaZnO4(m = 1) | ○ | ○ | ○ | ○ | ○ | ○ | ○ |
| DIFFRACTION | InGaZn2O5(m = 2) | | | | | ○ | | ○ |
| | InGaZn3O6(m = 3) | | | | | | | |
| | InAlZnO4(m = 1) | | | | | | | |
| | InAlZn2O5(m = 2) | | | | | | | |
| | In2Ga2ZnO7 | ○ | ○ | ○ | ○ | | ○ | |
| TARGET | APPEARANCE (WHITE-SPOT) | Δ | ○ | ○ | ○ | ○ | Δ | Δ |
| PROPERTIES | RELATIVE DENSITY(g/cm³) | 6.1 | 6.3 | 6.2 | 6.3 | 6.0 | 6.1 | 6.1 |
| | BULK RESISTANCE(mΩ cm) | 2.5 | 0.9 | 0.9 | 0.9 | 1.1 | 2.7 | 2.1 |
| | UNIFORMITY OF RESISTANCE | <5% | <5% | <5% | <5% | <5% | <5% | <5% |
| | NUMBER OF PINHOLES (NUMBER/mm²) | <10 | <10 | <10 | <10 | <10 | <10 | <10 |

TABLE 1-continued

| | | | | | | | | |
|---|---|---|---|---|---|---|---|---|
| FILM FORMING PROPERTIES ON TARGET | SPUTTERING RATE (Å/sec) | 1.4 | 1.5 | 1.5 | 1.5 | 1.4 | 1.5 | 1.4 |
| | ABNORMAL ELECTRICAL DISCHARGE(NUMBER/ 96 HOURS.) | <10 | <10 | <10 | <10 | <10 | <10 | <10 |
| | PARTICLES | ○ | ○ | ○ | ○ | ○ | ○ | ○ |
| | NODULES | ◎ | ◎ | ◎ | ◎ | ○ | ◎ | ○ |
| TFT PROPERTIES | MOBILITY(cm²/Vs) | 8 | 8 | 8 | 8 | 7 | 8 | 9 |
| | ON-OFF RATIO | $10^9$ | $10^9$ | $10^9$ | $10^9$ | $10^9$ | $10^9$ | $10^9$ |
| | OFF CURRENT(pA) | 0.05 | 0.05 | 0.05 | 0.05 | 0.1 | 0.05 | 0.1 |
| | S VALUE | 0.2 | 0.2 | 0.2 | 0.2 | 0.2 | 0.2 | 0.2 |
| | Vth(V) | 0.5 | 0.3 | 0.3 | 0.3 | 0.2 | 0.5 | 0.2 |
| | MOBILITY VARIATION | 2% | 1% | 1% | 1% | 2% | 4% | 4% |

| | | EXAMPLES | | | | | |
|---|---|---|---|---|---|---|---|
| | | 8 | 9 | 10 | 11 | 12 | 13 |
| | | METHOD FOR PRODUCING A TARGET | | | | | |
| | | SPS | SPS | SPS | SIN-TERED | SIN-TERED | SIN-TERED |
| TOTAL COMPOSITION RATIO OF SINTERED BODY | In/(In + Zn + Ga) | 0.35 | 0.34 | 0.34 | 0.38 | 0.31 | 0.36 |
| | Zn/(In + Zn + Ga) | 0.48 | 0.32 | 0.32 | 0.32 | 0.44 | 0.28 |
| | Ga/(In + Zn + Ga) | 0.17 | 0.34 | 0.34 | 0.3 | 0.25 | 0.36 |
| METAL HAVING FOR OR MORE VALENCES IN SINTERED BODY | METALS | — | — | — | Ge | Ge | Ge |
| | CONTENT(ppm) | — | — | — | 500 | 500 | 500 |
| X-RAY DIFFRACTION | InGaZnO4(m = 1) | ○ | ○ | ○ | ○ | ○ | ○ |
| | InGaZn2O5(m = 2) | ○ | | | | ○ | |
| | InGaZn3O6(m = 3) | ○ | | | | | |
| | InAlZnO4(m = 1) | | ○ | | | | |
| | InAlZn2O5(m = 2) | | | ○ | | | |
| | In2Ga2ZnO7 | | | | ○ | | ○ |
| TARGET PROPERTIES | APPEARANCE (WHITE-SPOT) | Δ | Δ | Δ | ○ | ○ | ○ |
| | RELATIVE DENSITY(g/cm³) | 6.0 | 6.1 | 6.1 | 6.3 | 6.1 | 6.1 |
| | BULK RESISTANCE(mΩ cm) | 1.2 | 3.2 | 2.9 | 0.9 | 0.9 | 2.7 |
| | UNIFORMITY OF RESISTANCE | <5% | <5% | <5% | <5% | <5% | <5% |
| | NUMBER OF PINHOLES (NUMBER/mm²) | <10 | <10 | <10 | <10 | <10 | <10 |
| FILM FORMING PROPERTIES ON TARGET | SPUTTERING RATE (Å/sec) | 1.3 | 1.4 | 1.4 | 1.5 | 1.4 | 1.5 |
| | ABNORMAL ELECTRICAL DISCHARGE(NUMBER/ 96 HOURS.) | <10 | <10 | <10 | <10 | <10 | <10 |
| | PARTICLES | ○ | ○ | ○ | ○ | ○ | ○ |
| | NODULES | ○ | ○ | ○ | ◎ | ○ | ◎ |
| TFT PROPERTIES | MOBILITY(cm²/Vs) | 10 | 8 | 8 | 11 | 12 | 11 |
| | ON-OFF RATIO | $10^9$ | $10^9$ | $10^9$ | $10^9$ | $10^9$ | $10^9$ |
| | OFF CURRENT(pA) | 0.1 | 0.05 | 0.05 | 0.05 | 0.1 | 0.05 |
| | S VALUE | 0.1 | 0.2 | 0.2 | 0.2 | 0.2 | 0.2 |
| | Vth(V) | 0.1 | 0.5 | 0.5 | 0.2 | 0.1 | 0.3 |
| | MOBILITY VARIATION | 4% | 6% | 5% | 1% | 1% | 2% |

TABLE 2

| | | COMPARATIVE EXAMPLES | | | |
|---|---|---|---|---|---|
| | | 1 | 2 | 3 | 4 |
| METHOD FOR PRODUCING A TARGET | | SINTERED | SINTERED | SINTERED | SINTERED |
| TOTAL COMPOSITION RATIO OF SINTERED BODY | In/(In + Zn + Ga) | 0.33 | 0.33 | 0.4 | 0.15 |
| | Zn/(In + Zn + Ga) | 0.34 | 0.34 | 0.2 | 0.18 |
| | Ga/(In + Zn + Ga) | 0.33 | 0.33 | 0.4 | 0.67 |
| METAL HAVING FOR OR MORE VALENCES IN SINTERED BODY | METALS | — | — | — | |
| | CONTENT(ppm) | — | — | — | |
| X-RAY DIFFRACTION | InGaZnO4(m = 1) | ○ | ○ | | |
| | InGaZn2O5(m = 2) | | | | |
| | InGaZn3O6(m = 3) | | | | |
| | InAlZnO4(m = 1) | | | | |
| | InAlZn2O5(m = 2) | | | | |
| | In2Ga2ZnO7 | | | ○ | |
| | ZnO | | | | ○ |

TABLE 2-continued

| | | COMPARATIVE EXAMPLES | | | |
|---|---|---|---|---|---|
| | | 1 | 2 | 3 | 4 |
| TARGET PROPERTIES | APPEARANCE (WHITE-SPOT) | x | x | x | x |
| | RELATIVE DENSITY(g/cm$^3$) | 5.9 | 5.9 | 5.8 | 4.5 |
| | BULK RESISTANCE(mΩcm) | 21 | 40 | 50 | 1000 |
| | UNIFORMITY OF RESISTANCE | 12% | 11% | 9% | 17% |
| | NUMBER OF PINHOLES(NUMBER/mm$^2$) | 80 | 82 | 45 | 1800 |
| FILM FORMING PROPERTIES ON TARGET | SPUTTERING RATE (Å/sec) | 1.1 | 1.0 | 0.9 | 0.6 |
| | ABNORMAL ELECTRICAL DISCHARGE (NUMBER/96 hours.) | 80 | 79 | 120 | 980 |
| | PARTICLES | x | x | x | x |
| | NODULES | x | x | x | x |
| TFT PROPERTIES | MOBILITY(cm$^2$/Vs) | 7 | 8 | 7 | 0.5 |
| | ON-OFF RATIO | 10$^9$ | 10$^9$ | 10$^9$ | 10$^4$ |
| | OFF CURRENT (pA) | 0.05 | 0.05 | 0.05 | 5 |
| | S VALUE | 0.3 | 0.3 | 0.4 | 3 |
| | Vth(V) | 0.5 | 0.5 | 0.5 | −1.2 |
| | MOBILITY VARIATION | 16% | 12% | 10% | 20% |

[Formation of an Amorphous Oxide Thin Film]

Continuous film forming tests by DC sputtering using oxides of Examples and Comparative Examples were conducted so as to obtain amorphous oxide thin films. Specifically, a film forming device using DC magnetron sputtering method which is one of DC sputtering methods was loaded and then a semi-conductor film was formed on a glass substrate (Corning 1737).

Sputtering conditions were set to substrate temperature; 25, ultimate pressure; 1×10$^{-6}$ Pa, atmospheric gas; Ar 99.5% and Oxygen 0.5%, sputter pressure (Total pressure); 2×10$^{-1}$ Pa, supplied electric power 100 W, film forming time 8 minutes, S-T distance 100 mm.

[Evaluation on Oxides]

A large sputtering target was prepared by sintering it using the same method as that of the above-mentioned sintered body.

Continuous film forming tests by DC sputtering were conducted and then evaluated as follows.

Sputtering Rate

Sputtering rate (film forming speed) was calculated from a film thickness measured by a sensing pin type surface figure measuring device: Dectak (ULVAC, Inc.) Divided by film forming time.

Frequency of Occurring Abnormal Discharge (Arcing)

Frequency of occurring abnormal discharge per 3 hours was measured. Evaluation was conduct based on 4 levels, i.e. up to 10 times:, up to 20 times: ○, up to 50 times:, and more than 50 times: x.

Amount of Particles (Dusts)

A glass slide was located in a chamber, and then density of particles having 1 μm or more adhered on the glass slide after 96 hour-continuous film forming were determined using a microscope.

Evaluation was conduct based on 4 levels, from those having less particles, up to 1 particle/cm$^2$:, up to 10$^2$ particles/cm$^2$: ○, up to 10$^4$ particles/cm$^2$:, and more than 10$^4$ particles/cm$^2$: x.

Density of Nodules Developed

From a photo of a film formed sputtering target after 96 hour-continuous film forming, an area covered by nodules were calculated and then density of Nodules developed was calculated from the following formula.

Density of Nodules developed=Nodule developed area/sputtering target area

Evaluation was conduct based on 4 levels, from those having less Nodules, up to 10$^{-4}$:, up to 10$^{-2}$: ○, up to 10$^{-1}$:, and more than 10$^{-1}$: x.

Stability in Continuous Film Forming

Among 20 batches, ratio of average field effect mobility between 1st batch and 20th batch (1st batch/20th batch) was determined. Evaluation was conduct based on 4 levels, from those having excellent reproducibility in TFT properties, up to 1.10:, up to 1.20: ○, up to 1.50:, and more than 1.50: x.

[Preparation of Thin Film Transistor]

By using the amorphous oxide thin film obtained by sputtering oxides of the above-mentioned Examples and Comparative examples as a channel layer of a thin film transistor, the thin film transistor shown in FIG. 5 (Invert staggered TFT element, hereinafter might be abbreviated as "TFT") was obtained. Specifically, a glass substrate (Corning Inc., Corning1737) was prepared as a substrate. On this substrate, Ti having thickness of 5 nm (a contact layer), Au having thickness of 50 nm, and Ti having thickness of 5 nm were laminated in this order by an electron beam vapor deposition method. A gate electrode was formed from the laminated film by a photo-lithography method and a lift-off method. SiO$_2$ film having thickness of 200 nm was formed on the upper surface of the obtained gate electrode by a TEOS-CVD method so as to form a gate insulation film.

In addition, an amorphous oxide thin film (an In—Ga—Zn—O oxide semi-conductor) having thickness of 30 nm was deposited as a channel layer by a RF sputter method using the oxide sintered bodies obtained by the Examples and Comparative examples as a target. In this connection, power supplied from RF power source was 200 W. During film forming, total pressure was set at 0.4 Pa, gas flow ratio of Ar:O$_2$=95:5. Substrate temperature was 25.

By using the deposited amorphous oxide thin film, and using a photo-lithography method and an etching method, elements having W=100 μm and L=20 μm were prepared. Thus obtained elements were heat-treated under ambient pressure at 300 for 60 minutes.

After the heat treatment, Ti having thickness of 5 nm, Au having thickness of 50 nm, and Ti having thickness of 5 nm were laminated on each element in this order. A source electrode and a drain electrode were formed by a photo-lithography method and a lift-off method. SiO$_2$ film having thickness of 200 nm was further deposited on the elements by a sputter method as a protecting film.

[Evaluation]

Mobility, S value, ON-OFF ratio, reproducibility of TFT properties, and Uniformity of TFT properties were evaluated and shown in Tables.

Mobility, ON-OFF Ratio, Off Current (pA), S Value, Vth (V)

By using a semi-conductor parameters analyzer (Keithley 4200), Mobility, ON-OFF ratio, Off current (pA), and S value were determined within dry nitrogen under ambient temperature and shading.

S value (Swing Factor) is to show steepness of drain current which rises rapidly from OFF position to ON position when gate voltage is increased from Off position. As defined by the following formula, increment of gate voltage when drain current increases single digit (10 times) is S value.

$$S\text{ value}=dVg/d\log(Ids)$$

Lower S value means high steepness in rising (cf. Yasuhiro Ukai, "Hakumaku-trangista gijutu no subete (All about Thin Film Transistor Technique)", Kogyo Chosa Kai, 2007).

Vth Variation

Vth variation was determined by measuring an amount of Vth change under 50 during 24 hours operation using the semi-conductor parameters analyzer.

Mobility variation was determined from an average of mobility against standard deviation of mobility in which these average and standard deviation was obtained from 20 TFT samples.

BRIEF DESCRIPTION OF THE DRAWINGS

FIG. 2 A chart of X-ray diffraction with respect to the oxide of Comparative example 1

FIG. 3 A chart of X-ray diffraction with respect to the oxide of Comparative example 3

FIG. 4(a) A schematic view of $InMO_3(ZnO)_n$ type structure and $(YbFeO_3)_2FeO$ type structure FIG. 4(b) A schematic view of $InMO_3(ZnO)_n$ type structure and $(YbFeO_3)_2FeO$ type structure FIG. 5 A schematic view of a thin film transistor FIG. 6(1) shows a schematic view of a thin film transistor (a source electrode).

Figure 1:
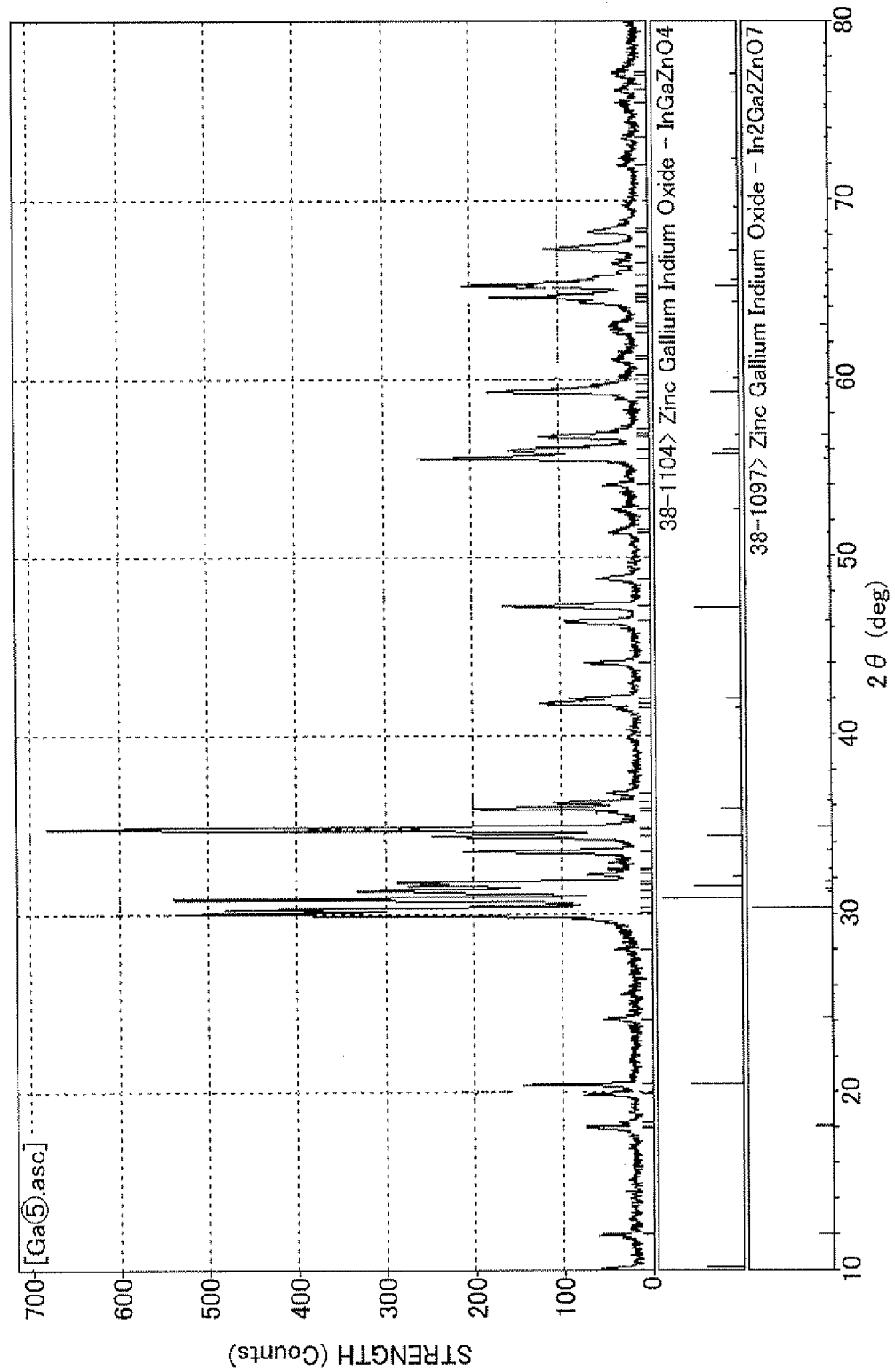
FIG. 1 A chart of X-ray diffraction with respect to the oxide of Example 1
Figure 5:
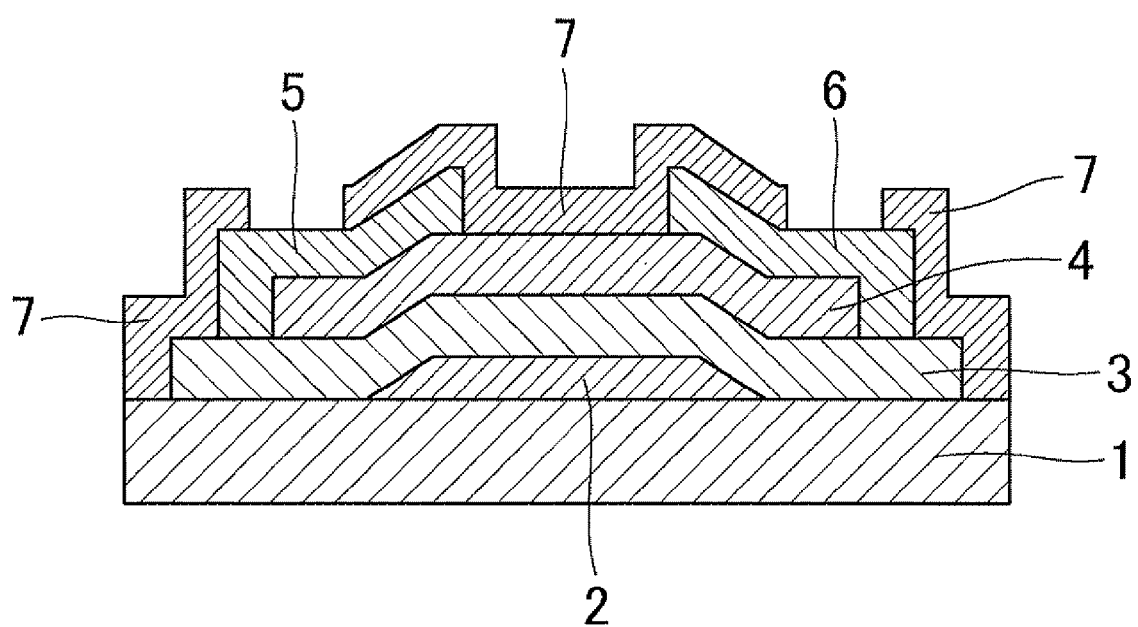
Figure 6:
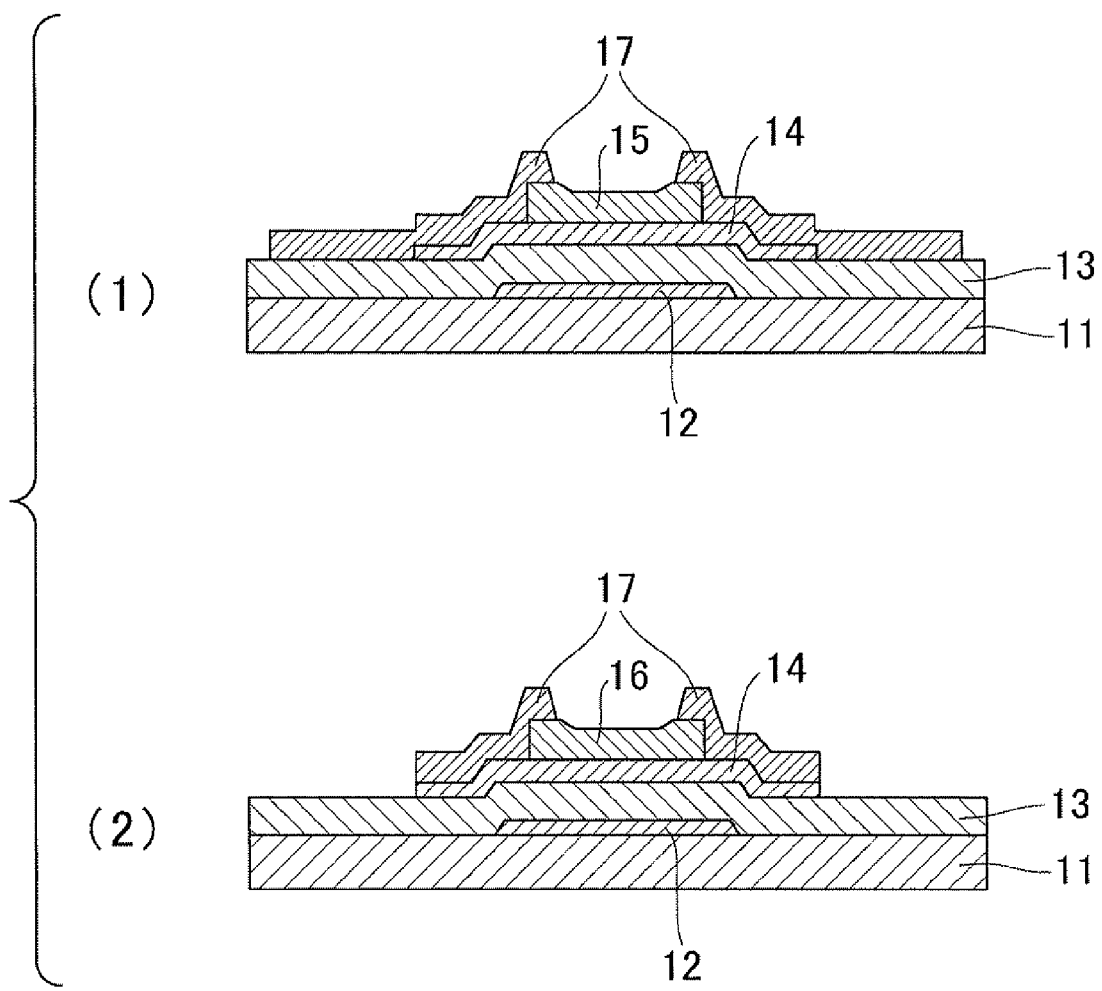
FIG. 6(2) shows a schematic view of a thin film transistor (a drain electrode)

| Explanation for numbers | |
|---|---|
| 1 | Substrate |
| 2 | Gate electrode |
| 3 | Gate insulation film |
| 4 | Channel layer |
| 5 | Source electrode |
| 6 | Drain electrode |
| 7 | Protective film |
| 11 | Substrate |
| 12 | Gate electrode |
| 13 | Gate insulation film |
| 14 | Channel layer |
| 15 | Source electrode |
| 16 | Drain electrode |
| 17 | Protective film |

We claim:

1. A sputtering target composed of an oxide sintered body containing two or more homologous crystal structures, wherein the homologous crystal structures include a first crystal phase and a second crystal phase, wherein the first crystal phase and the second crystal phase are selected from the group consisting of a $InMO_3(ZnO)_m$ crystal structure wherein M is a tervalent metal element and m is from 0.5 to 10, a $(YbFeO_3)_2FeO$ type crystal structure and mixture thereof, and wherein a maximum peak strength of X-ray diffraction for the first crystal phase P(1) and a maximum peak strength of X-ray diffraction for the second crystal phase P(2) meet a peak strength ratio of P(1)/P(2)=0.05~20.

2. The sputtering target of claim 1, wherein said oxide sintered body includes Indium element (In), Gallium element (Ga), and Zinc element (Zn), and wherein said homologous crystal structures comprise two kinds of structure which are an $InGaO_3(ZnO)_{m1}$ type crystal structure and an $InGaO_3(ZnO)_{m2}$ type crystal structure such that m1 is different from m2.

3. The sputtering target of claim 1, wherein said oxide sintered body includes Indium element (In), Gallium element (Ga), and Zinc element (Zn), and wherein said oxide sintered body contains an $InGaZn_mO_{3+m}$ crystal phase indicating an $InMO_3(ZnO)_m$ type crystal structure, and an $In_2Ga_2ZnO_7$ crystal phase indicating a $(YbFeO_3)_2FeO$ type crystal structure.

4. The sputtering target of claim 3, wherein a maximum peak strength of X-ray diffraction for said $InGaZnO_4$ crystal phase P(1) and a maximum peak strength of X-ray diffraction for said $In_2Ga_2ZnO_7$ crystal phase P(2) meet a peak strength ratio of P(1)/P(2)=0.05~20.

5. The sputtering target of claim 1, wherein said oxide sintered body includes Indium element (In), Gallium element (Ga), and Zinc element (Zn), and wherein said oxide sintered body contains an $InGaZnO_4$ crystal phase indicating $InMO_3(ZnO)_m$ type crystal structure, and an $InGaZn_2O_5$ crystal phase indicating a $InMO_3(ZnO)_m$ type crystal structure.

6. The sputtering target of claim 1, wherein said oxide sintered body contains a metal element (X) having positive four or more valences.

7. The sputtering target of claim 6, wherein the metal element (X) having positive four or more valences is one or more elements selected from the group consisting of tin, zirconium, germanium, cerium, niobium, tantalum, molybdenum, tungsten, and titanium.

8. The sputtering target of claim 6, wherein said oxide sintered body comprises an $InGaZn_mO_{3+m}$ crystal phase indicating $InMO_3(ZnO)_m$ type crystal structure in which a part of In or Ga is substituted by said metal element having positive four or more valences, or an $In_2Ga_2ZnO_7$ crystal phase indicating a $(YbFeO_3)_2FeO$ type crystal structure in which a part of In or Ga is substituted by said metal element having positive four or more valences.

9. A method for preparing a sputtering target of claim 1 comprising the following steps;
    (a) mixing a crude oxide powder;
    (b) forming the obtained mixture; and
    (c) sintering the obtained formed body.

10. The method for preparing a sputtering target of claim 9, wherein In, Ga, and Zn are mixed in the following atom ratio;

$$0.1 \leq In/(In+Ga+Zn) \leq 0.9$$

$$0.05 \leq Ga/(In+Ga+Zn) \leq 0.6$$

$$0.05 \leq Zn/(In+Ga+Zn) \leq 0.9.$$

11. The method for preparing a sputtering target of claim 9, wherein sintering is conducted at 1440 to 1600° C. for 0.5 to 15 hours.

12. The method for preparing a sputtering target of claim 9, wherein the sintering is conducted within oxygen gas atmosphere.

13. A method for forming an amorphous oxide thin film having less than $10^{18}/cm^3$ of electric carrier concentration, comprising a step of;
  (i) conducting sputtering using the sputtering target of claims 1 at 25 to 450° C. of film forming temperature.

14. The method of claim 13 wherein said amorphous oxide thin film is used for a channel layer of a thin film transistor.

15. A method for manufacturing a thin film transistor containing an amorphous oxide thin film and an oxide insulation layer, comprising steps of
  (ii) heat-treating the amorphous oxide thin film formed by claim 13 within oxidation atmosphere; and
  (iii) forming the oxide insulation layer on said heat treated amorphous oxide thin film.

16. The sputtering target of claim 1, wherein In, Ga, and Zn are present in the following atom ratio;

$0.1 \leq In/(In+Ga+Zn) \leq 0.9$ $0.05 \leq Ga/(In+Ga+Zn) \leq 0.6$ $0.05 \leq Zn/(In+Ga+Zn) \leq 0.9$.

17. The sputtering target of claim 1, wherein the first crystal phase is $InGaZnO_4$ and the second crystal phase is $In_2Ga_2ZnO_7$.

18. The sputtering target of claim 1, wherein the first crystal phase is $InGaZnO_4$ and the second crystal phase is $InGaZn_2O_5$.

* * * * *